(12) United States Patent
Cho et al.

(10) Patent No.: US 10,825,893 B2
(45) Date of Patent: Nov. 3, 2020

(54) SEMICONDUCTOR DEVICES

(71) Applicant: Samsung Electronics Co., Ltd., Suwon-si (KR)

(72) Inventors: Kyu-ho Cho, Seoul (KR); Sang-yeol Kang, Yongin-si (KR); Sun-min Moon, Yongin-si (KR); Young-lim Park, Anyang-si (KR); Jong-bom Seo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/003,675

(22) Filed: Jun. 8, 2018

(65) Prior Publication Data

US 2019/0165088 A1 May 30, 2019

(30) Foreign Application Priority Data

Nov. 28, 2017 (KR) .................. 10-2017-0161003

(51) Int. Cl.
*H01L 49/02* (2006.01)
*H01L 21/02* (2006.01)
*H01L 29/06* (2006.01)
*H01L 27/108* (2006.01)

(52) U.S. Cl.
CPC ............ *H01L 28/75* (2013.01); *H01L 21/022* (2013.01); *H01L 21/02181* (2013.01); *H01L 21/02189* (2013.01); *H01L 21/02304* (2013.01); *H01L 21/02672* (2013.01); *H01L 27/10814* (2013.01); *H01L 27/10817* (2013.01); *H01L 27/10852* (2013.01); *H01L 28/65* (2013.01); *H01L 29/0649* (2013.01)

(58) Field of Classification Search
CPC ............ H01L 28/75; H01L 27/10817; H01L 21/02304; H01L 21/02189; H01L 27/10852; H01L 27/10814; H01L 21/02181; H01L 21/022; H01L 21/02672; H01L 29/0649; H01L 28/65
See application file for complete search history.

(56) References Cited

U.S. PATENT DOCUMENTS

| | | | |
|---|---|---|---|
| 6,982,230 B2 | 1/2006 | Cabral, Jr. et al. | |
| 7,709,359 B2 | 5/2010 | Boescke et al. | |
| 8,354,660 B2 | 1/2013 | Sekar et al. | |
| 9,466,660 B2 | 10/2016 | Rocklein et al. | |
| 9,761,798 B2 | 9/2017 | Kamimuta et al. | |
| 2004/0087081 A1 | 5/2004 | Aitchison et al. | |
| 2005/0224913 A1* | 10/2005 | Bhat | H01L 28/56 257/532 |
| 2008/0203529 A1* | 8/2008 | Kang | H01L 28/40 257/532 |

(Continued)

*Primary Examiner* — Su C Kim
(74) *Attorney, Agent, or Firm* — Harness, Dickey & Pierce, P.L.C.

(57) ABSTRACT

A semiconductor device includes a first electrode on a substrate, a second electrode on the substrate, a dielectric layer structure between the first electrode and the second electrode, and a crystallization inducing layer between the dielectric layer structure and the first electrode. The dielectric layer structure includes a first dielectric layer including a first dielectric material and a second dielectric layer on the first dielectric layer and including a second dielectric material.

11 Claims, 24 Drawing Sheets

(56) References Cited

U.S. PATENT DOCUMENTS

| | | | |
|---|---|---|---|
| 2011/0057292 A1* | 3/2011 | Hu | H01L 21/743 |
| | | | 257/532 |
| 2012/0021612 A1* | 1/2012 | Nakagawa | C23C 14/08 |
| | | | 438/785 |
| 2016/0133691 A1* | 5/2016 | Phatak | H01L 28/75 |
| | | | 257/532 |
| 2017/0069711 A1 | 3/2017 | Lee et al. | |
| 2018/0182760 A1* | 6/2018 | Lin | H01L 21/02178 |

* cited by examiner

US 10,825,893 B2

SEMICONDUCTOR DEVICES

CROSS-REFERENCE TO RELATED APPLICATION

This application claims the benefit of Korean Patent Application No. 10-2017-0161003, filed on Nov. 28, 2017, in the Korean Intellectual Property Office, the disclosure of which is incorporated herein in its entirety by reference.

BACKGROUND

The inventive concepts relate to semiconductor devices, and more particularly, to semiconductor devices including a capacitor structure.

Downscaling of a semiconductor device also reduces the size of a capacitor structure of a DRAM device. However, even if the size of the capacitor structure is reduced, capacitance required for a unit cell of the DRAM device has a constant value.

SUMMARY

In some example embodiments, a metal-insulator-metal (MIM) capacitor includes a high-k dielectric material having a high dielectric constant and a metal electrode.

The inventive concepts provide a semiconductor device including a capacitor structure having a high capacitance.

According to an aspect of the inventive concepts, a semiconductor device may include a first electrode on a substrate, a second electrode on the substrate, a dielectric layer structure between the first electrode and the second electrode, and a crystallization inducing layer between the dielectric layer structure and the first electrode. The dielectric layer structure may include a first dielectric layer including a first dielectric material and a second dielectric layer on the first dielectric layer, the second dielectric layer including a second dielectric material. The first dielectric material may include hafnium oxide having a tetragonal crystal According to another aspect of the inventive concepts, a semiconductor device may include a first electrode on a substrate, a second electrode on the substrate, and a dielectric layer structure between the first electrode and the second electrode. The dielectric layer structure may include a first dielectric layer in contact with the first electrode, the first dielectric layer including a first dielectric material. The dielectric layer structure may include a second dielectric layer on the first dielectric layer, the second dielectric layer including a second dielectric material. The first electrode may include iridium, molybdenum, or molybdenum nitride, and the first dielectric layer may include zirconium oxide having a tetragonal crystal phase.

According to another aspect of the inventive concepts, a semiconductor device may include a contact structure on a substrate, and a capacitor structure on the contact structure. The capacitor structure may include a lower electrode electrically connected to the contact structure, a dielectric layer structure on the lower electrode, and an upper electrode on the dielectric layer structure. The dielectric layer structure may include a first dielectric layer including a first dielectric material and a second dielectric layer on the first dielectric layer, the second dielectric layer including a second dielectric material. The dielectric layer structure may include at least one material of hafnium oxide having a tetragonal crystal phase, or zirconium oxide having a tetragonal crystal phase.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
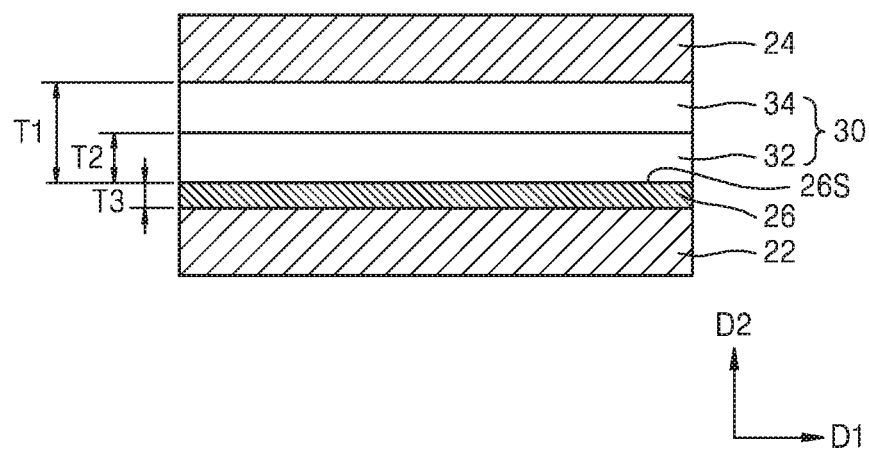
FIG. 1 is a cross-sectional view showing a semiconductor device 10 according to some example embodiments.

FIG. 1 is a cross-sectional view showing a semiconductor device 10 according to some example embodiments.

Referring to FIG. 1, the semiconductor device 10 may include a first electrode 22, a second electrode 24, a crystallization inducing layer 26, and a dielectric layer structure 30. The dielectric layer structure 30 may be between the first electrode 22 and the second electrode 24. The crystallization inducing layer 26 may be between the first electrode 22 and the dielectric layer structure 30.

In the some example embodiments, the first electrode 22 may include at least one selected from doped polysilicon, a metal such as ruthenium (Ru), titanium (Ti), tantalum (Ta), tungsten (W), etc., a conductive metal nitride such as titanium nitride (TiN), tantalum nitride (TaN), tungsten nitride (WN), etc., and a conductive metal oxide such as iridium oxide, etc. In other embodiments, the first electrode 22 may be a substrate doped with an impurity, for example, a substrate doped with a P-type impurity or a substrate doped with an N-type impurity.

In the some example embodiments, the second electrode 24 may include at least one material selected from doped polysilicon, a metal such as ruthenium (Ru), titanium (Ti), tantalum (Ta), tungsten (W), etc., a conductive metal nitride such as titanium nitride (TiN), tantalum nitride (TaN), tungsten nitride (WN), etc., and a conductive metal oxide such as iridium oxide, etc.

The first electrode 22 may correspond to a lower electrode of the capacitor structure, and the second electrode 24 may correspond to an upper electrode of the capacitor structure. In some example embodiments, the first electrode 22 may correspond to the upper electrode of the capacitor structure, and the second electrode 24 may correspond to the lower electrode of the capacitor structure. In some example embodiments, the first electrode 22 may be a channel region of a transistor.

The crystallization inducing layer 26 may be formed conformally on the first electrode 22. The crystallization inducing layer 26 may assist a material layer (for example, the dielectric layer structure 30) formed on the crystallization inducing layer 26 to preferentially orient in a crystal phase having a specific crystal structure. In some example embodiments, the crystallization inducing layer 26 may include niobium nitride (NbNx). In some example embodiments, the crystallization inducing layer 26 may include niobium nitride (NbNx) having a particular (or, in some example embodiments, predetermined) content of oxygen. For example, the crystallization inducing layer 26 may include niobium nitride (NbNx) having less than about 5 atomic percent (at %) of oxygen.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The crystallization inducing layer 26 may include a material having a work function that is higher ("greater in magnitude") than that of a material included in the first electrode 22 and the second electrode 24. Restated, the crystallization inducing layer 26 may include a material having a work function that is greater in magnitude than a work function of the first electrode and a work function of the second electrode 24. For example, when the first electrode 22 and the second electrode 24 include titanium nitride and the crystallization inducing layer 26 includes niobium nitride, the crystallization inducing layer 26 includes a material having a work function that is higher than that of titanium nitride, and thus a leakage current of the semiconductor device 10 may be reduced.

The dielectric layer structure 30 may be conformally formed on the crystallization inducing layer 26. As shown in FIG. 1, a first surface of the dielectric layer structure 30 may contact the crystallization inducing layer 26 and a second surface opposite the first surface may contact the second electrode 24. The dielectric layer structure 30 may include a first dielectric layer 32 including a first dielectric material and a second dielectric layer 34 including a second dielectric material different from the first dielectric material.

The first dielectric layer 32 may be disposed on the crystallization inducing layer 26. As shown in FIG. 1, the first dielectric layer 32 may be on a surface (e.g., upper surface 26S) of the crystallization inducing layer 26, and the crystallization inducing layer 26 and the first dielectric layer 32 may be in contact with each other. A substantially entire area (e.g., an entire area within manufacturing tolerances and/or material tolerances) of the first dielectric layer 32 may contact a surface 26S of the crystallization inducing layer 26. The first dielectric layer 32 may include metal oxide having a dielectric constant that is higher ("greater") than that of the second dielectric layer 34. Restated, the second dielectric layer 34 may have a dielectric constant that is smaller than a dielectric constant of the first dielectric layer 32. For example, the first dielectric layer 32 may include hafnium oxide having a tetragonal crystalline phase. For example, the dielectric layer structure 30 may exhibit a peak of 30.48°±0.2° by a (101) plane of the tetragonal crystal structure of the first dielectric layer 32 in an X-ray diffraction analysis ("based on being subjected to an X-ray diffraction analysis operation").

In some example embodiments, the first dielectric layer 32 and the crystallization inducing layer 26 may be formed to contact each other ("may contact each other") over the entire area thereof, and accordingly during an annealing process of the semiconductor device 10, the first dielectric layer 32 on the crystallization inducing layer 26 may be preferentially oriented to have a tetragonal crystal phase. That is, when the crystallization inducing layer 26 includes niobium nitride (NbNx) and the first dielectric layer 32 includes hafnium oxide, hafnium oxide may be crystallized to have the tetragonal crystalline phase by an interface energy characteristic between hafnium oxide and underlying niobium nitride (NbNx). On the contrary, when the crystallization inducing layer 26 is not formed, for example, when a dielectric layer including hafnium oxide is formed on titanium nitride (TiN), the dielectric layer may have a monoclinic crystalline phase by an interface energy characteristic between hafnium oxide and underlying titanium nitride (TiN).

Since the first dielectric layer 32 includes hafnium oxide having the tetragonal crystal phase, the total dielectric constant of the dielectric layer structure 30 may be significantly increased. In general, hafnium oxide having the tetragonal crystal phase has a dielectric constant that is significantly higher ("greater") than of hafnium oxide having the monoclinic crystal phase. Thus, the first dielectric layer 32 may have a dielectric constant higher by about 30% or more, when compared to the case where the first dielectric layer 32 includes hafnium oxide having the monoclinic crystal phase. A relationship between the crystal phase and the dielectric constant of the first dielectric layer 32 is described below with reference to FIGS. 22A to 22D.

The second dielectric layer 34 may be disposed on the first dielectric layer 32. The second dielectric layer 34 may include a second dielectric material different from the first dielectric material. The second dielectric material may include at least one material of zirconium oxide, aluminum oxide, silicon oxide, titanium oxide, yttrium oxide, scandium oxide, or lanthanide oxide.

The dielectric layer structure 30 may have a first thickness T1 in a second direction (e.g., a D2 direction in FIG. 1). The first thickness T1 may range from about 30 Å to about 200 Å. However, the first thickness T1 of the dielectric layer structure 30 is not limited thereto. The first dielectric layer 32 may have a second thickness T2 in the second direction (e.g., a D2 direction). The second thickness T2 of the first dielectric layer 32 may be greater than or equal to 40% of the first thickness T1 of the dielectric layer structure 30. Restated, a thickness (T2) of the first dielectric layer 32 may be equal to or greater than about 40% of a thickness (T1) of the dielectric layer structure 30. The first dielectric layer 32 may have a thickness that is equal to or greater than about 20 Å. For example, the second thickness T2 of the first dielectric layer 32 may range from about 20 Å to about 100 Å. The crystallization inducing layer 26 may have a third thickness T3 in the second direction (e.g., a D2 direction). The third thickness T3 may range from about 10 Å to about 50 Å. However, the third thickness T3 of the crystallization inducing layer 26 is not limited thereto.

In some example embodiments, the first dielectric layer 32 may have the relatively large second thickness T2 due to the crystallization inducing layer 26, and thus the total dielectric constant of the dielectric layer structure 30 may be increased. For example, the dielectric layer structure 30 may have a dielectric constant of about 40 to about 60. In general, when a dielectric layer includes hafnium oxide, it is known that the dielectric layer tends to be formed to have a monoclinic crystal phase of a relatively small dielectric constant, and the dielectric layer tends to be crystallized to a monoclinic crystal phase of a relatively small dielectric constant as a thickness of the dielectric layer increases. However, the first dielectric layer 32 may be formed to have the tetragonal crystal phase by the crystallization inducing layer 26 even at the relatively large second thickness T2, and thus the dielectric layer structure 30 may have a relatively high total dielectric constant.

According to the semiconductor device 10 according to some example embodiments, hafnium oxide included in the first dielectric layer 32 may be formed to have the tetragonal crystal phase due to the crystallization inducing layer 26. Since hafnium oxide having the tetragonal crystal phase has a significantly higher dielectric constant than that of hafnium oxide having the monoclinic crystal phase, the dielectric layer structure 30 may have a relatively high dielectric constant. Also, the first dielectric layer 32 may have the tetragonal crystalline phase by the crystallization inducing layer 26 even at the relatively large second thickness T2, and thus the dielectric layer structure 30 may have a relatively high dielectric constant. Also, since the crystallization inducing layer 26 includes a material having a work function that is higher than that of the first and second electrodes 22 and 24 (e.g., a work function greater than a work function of titanium nitride), a leakage current may be prevented. Thus, the semiconductor device 10 may have a relatively high capacitance while having a reduced leakage current.

Hereinafter, an X-ray diffraction analysis graph and a dielectric constant of a capacitor structure according to some example embodiments will be described with reference to FIGS. 22A to 22D in comparison with a capacitor structure according to a comparative example. In FIGS. 22A to 22D, with respect to a capacitor structure according to an experimental example group EX1 having the crystallization inducing layer 26 shown in FIG. 1 and a capacitor structure according to a comparative example group CO1 excluding the crystallization inducing layer 26, an X-ray diffraction analysis, a dielectric constant, and a leakage current are measured.

Figure 22A:
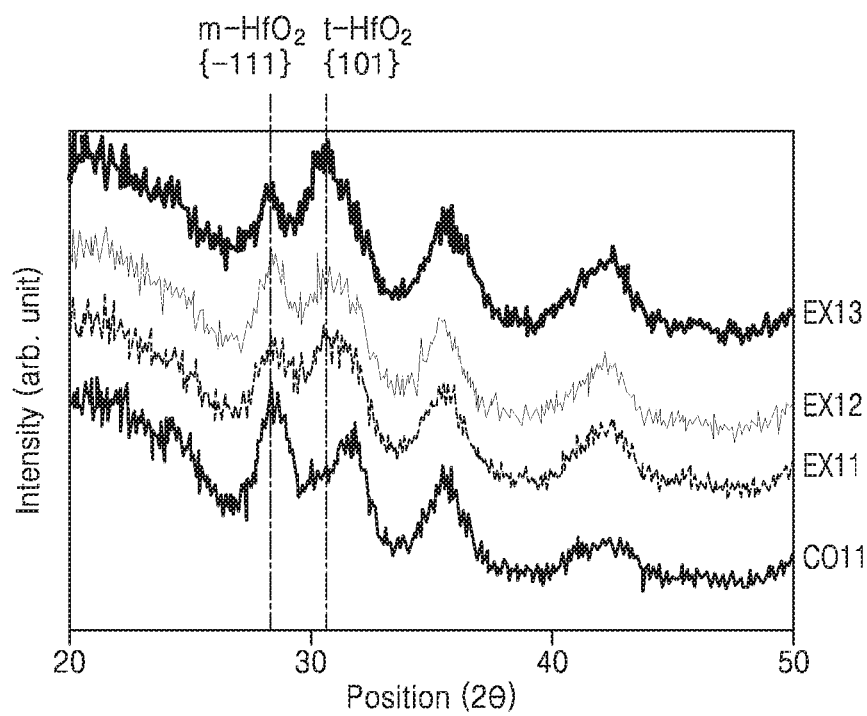
FIG. 22A is a graph of an X-ray diffraction analysis according to a comparative example and experimental examples.

FIG. 22A is a graph of an X-ray diffraction analysis according to comparative example 1 CO11 and experimental examples 1 to 3 EX11, EX12, and EX13.

In order to form a capacitor structure according to experimental examples 1 to 3 EX11, EX12, and EX13, the crystallization inducing layer 26 including niobium nitride and the first dielectric layer 32 including hafnium oxide are formed on the first electrode 22 including titanium nitride and annealed. To form a capacitor structure according to comparative example 1 CO11, the first dielectric layer 32 including hafnium oxide is formed on the first electrode 22 including titanium nitride and annealed. Experimental examples 1 to 3 EX11, EX12, and EX13 have slightly different nitrogen flow rates in an operation of forming the crystallization inducing layer 26, and all included the crystallization inducing layer 26 formed of niobium nitride.

Referring to FIG. 22A, in comparative example 1 CO11, a peak ("peak radiation emission") by a {-111} plane of a monoclinic crystal phase at about 28.30° is observed while a peak by a {101} plane of a tetragonal crystal phase at about 30.48° is not observed. Meanwhile, in experimental examples 1 to 3 EX11, EX12, and EX13, peaks by the {101} plane of the tetragonal crystal phase at about 30.48° are observed. That is, in comparative example 1 CO11 in which the crystallization inducing layer 26 is not formed, a hafnium oxide layer having the tetragonal crystal phase is not formed, while the hafnium oxide layer having the tetragonal crystal phase is formed on the crystallization inducing layer 26 including niobium nitride.

Table 1 below shows interface energy of hafnium oxide (m-HfO2) having the monoclinic crystal phase and hafnium oxide (t-HfO2) having the tetragonal crystal phase on niobium nitride and titanium nitride, and the interface energies are calculated from simulation.

TABLE 1

| Underlayer | m-HfO$_2$ interface energy (meV/Å$^2$) | t-HfO$_2$ interface energy (meV/Å$^2$) | interface energy difference (meV/Å$^2$) |
|---|---|---|---|
| niobium nitride | +420.5 | +286.6 | −143.9 |
| titanium nitride | +483.9 | +472.1 | −11.8 |

Referring to Table 1, interface energy between a niobium nitride surface and a hafnium oxide surface of a tetragonal structure may be significantly less than interface energy between the niobium nitride surface and a hafnium oxide surface of a monoclinic structure. Thus, it may be assumed that on the niobium nitride surface, hafnium oxide may be crystallized to be preferentially oriented in the tetragonal crystal phase, and such a simulation result coincides with the X-ray diffraction analysis result shown in FIG. 22A.

Figure 22B:
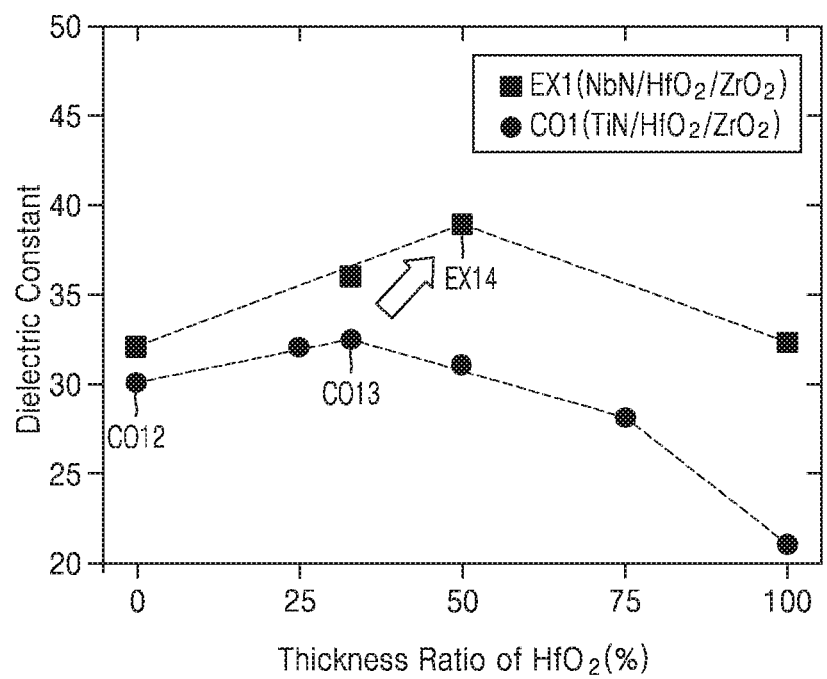
FIG. 22B is a graph showing dielectric constants of capacitor structures according to an experimental example group and a comparative example group.

FIG. 22B is a graph showing a dielectric constant according to a thickness ratio of hafnium oxide (or a dielectric constant according to hafnium oxide content in the dielectric layer structure 30) with respect to the capacitor structure according to an experimental example group EX1 and the capacitor structure according to a comparative example group CO1.

For the capacitor structure according to the experimental example group EX1, the first dielectric layer 32 including hafnium oxide and the second dielectric layer 34 including zirconium oxide are formed on the crystallization inducing layer 26 including niobium nitride. For the capacitor structure according to the comparative example group CO1, the first dielectric layer 32 including hafnium oxide and the second dielectric layer 34 including zirconium oxide are formed on the first electrode 22 including titanium nitride.

In FIG. 22B, the X axis is a ratio of the second thickness T2 of the first dielectric layer 32 relative to the first thickness T1 of the dielectric layer structure 30, which corresponds to content of hafnium oxide included in the dielectric layer structure 30 or volume of the first dielectric layer 32 relative to the total volume of the dielectric layer structure 30.

Referring to FIG. 22B, the experimental example group EX1 including the crystallization inducing layer 26 exhibited a higher dielectric constant, compared with the comparative example group CO1 excluding the crystallization inducing layer 26. In particular, the maximum value of the dielectric constant obtained from the experimental example group EX1 is higher than the maximum value of the dielectric constant obtained from the comparative example group CO1 by about 30%.

Also, in the case of the experimental example group EX1, the first dielectric layer 32 including hafnium oxide exhibits the largest dielectric constant when reaching about 50% of the total thickness (i.e., experimental example 4 EX14), whereas in the case of the comparative example group CO1, the first dielectric layer 32 including hafnium oxide exhibits the largest dielectric constant when reaching about 33% of the total thickness (i.e., comparative example 3 CO13). That is, in order to obtain a high total dielectric constant, it may be seen that the experimental example group EX1 may form the first dielectric layer 32 to a larger thickness than the comparative example group CO1.

As described with reference to FIG. 22A, it is generally known that the greater the thickness of a dielectric layer, the easier it is to crystallize the dielectric layer to a monoclinic crystal phase having a relatively small dielectric constant. However, according to some example embodiments, the first dielectric layer 32 may be formed to have a tetragonal crystal phase due to the crystallization inducing layer 26 even at a relatively large second thickness.

Figure 22C:
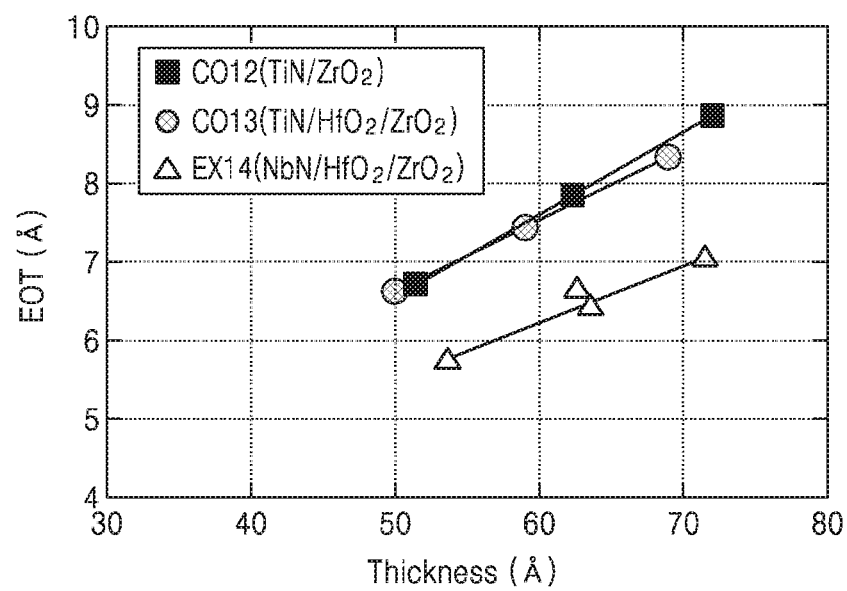
FIG. 22C is a graph showing equivalent oxide thicknesses of capacitor structures according to comparative examples and an experimental example.
Figure 22D:
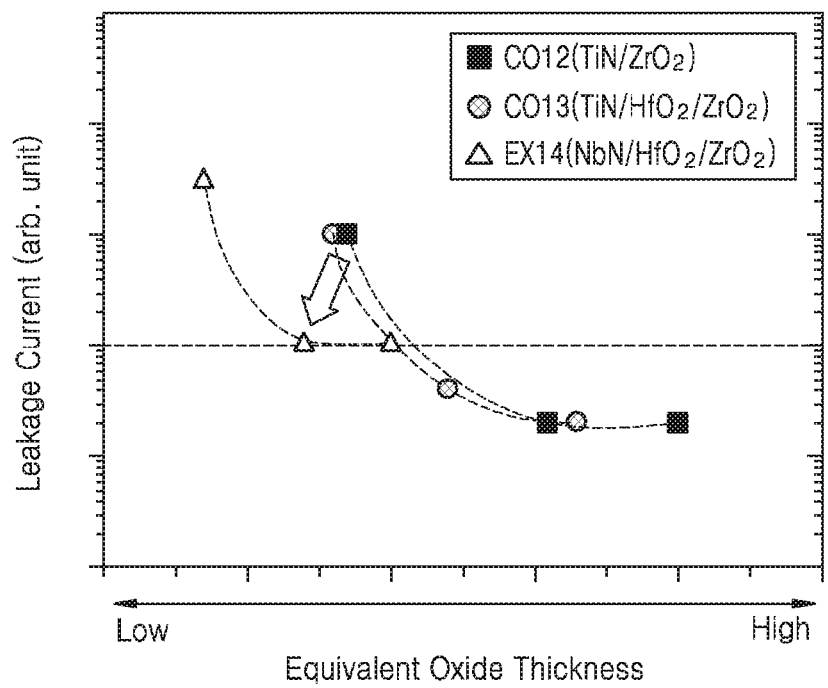
FIG. 22D is a graph showing a leakage current of capacitor structures according to comparative examples and an experimental example as a function of an equivalent oxide thickness.

FIG. 22C is a graph showing equivalent oxide thicknesses of comparative examples 2 and 3 CO12 and CO13 and experimental example 4 EX14 of FIG. 22B as a function of a layer thickness. FIG. 22D is a graph showing a leakage current of comparative examples 2 and 3 CO12 and CO13 and experimental example 4 EX14 as a function of the equivalent oxide thickness.

Specifically, comparative example 2 CO12 shows a capacitor structure in which only the second dielectric layer 34 including zirconium oxide is formed on the first electrode 22 including titanium nitride, and comparative example 3 CO13 shows a capacitor structure in which on the first electrode 22 including zirconium oxide, the first dielectric layer 32 including hafnium oxide is formed to about 33% of the total thickness and the second dielectric layer 34 including zirconium oxide is formed to about 67% of the total thickness. Experimental example 4 EX14 shows a capacitor structure in which on the crystallization inducing layer 26 including niobium nitride, the first dielectric layer 32 including hafnium oxide is formed to about 50% of the total thickness, and the second dielectric layer 34 including zirconium oxide is formed to about 50% of the total thickness.

Referring to FIG. 22C, a dielectric constant of about 38 may be obtained from the graph of comparative example 2 CO12, and a dielectric constant of about 43 may be obtained from the graph of comparative example 3 CO13, whereas a dielectric constant of about 56 may be obtained from the graph of experimental example 4 EX14. That is, the capacitor structure according to experimental example 4 EX14 including the crystallization inducing layer 26 exhibits an increased dielectric constant, higher than that of comparative example 3 CO13 excluding the crystallization inducing layer 26 by about 30% or more.

Referring to FIG. 22D, as shown by arrows, experimental example 4 EX14 shows a leakage current reduced even at a small equivalent oxide thickness as compared to comparative examples 2 and 3 CO12 and CO13. As described above, it may be considered that the leakage current of the capacitor structure is reduced since the crystallization inducing layer 26 includes a material having a higher work function than that of the first and second electrodes 22 and 24.

Figure 2:
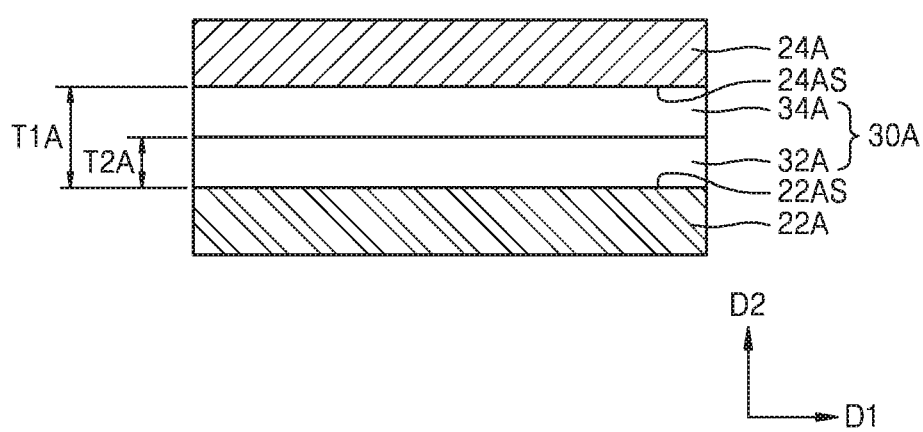
FIG. 2 is a cross-sectional view of a semiconductor device according to some example embodiments.

FIG. 2 is a cross-sectional view of a semiconductor device 10A according to some example embodiments. In FIG. 2, the same reference numerals as in FIG. 1 denote the same components.

Referring to FIG. 2, the semiconductor device 10A may include a first electrode 22A, a second electrode 24A, and a dielectric layer structure 30A between the first electrode 22A and the second electrode 24A. The dielectric layer structure 30A may include a first dielectric layer 32A including a first dielectric material and a second dielectric layer 34A including a second dielectric material, the second dielectric material being different from the first dielectric material. As shown in FIG. 2, the first dielectric layer 32A may be in contact with the first electrode 22A. As further shown in FIG. 2, the second dielectric layer 34A may be on a surface 24AS of the second electrode 24A and may be in contact with the second electrode 24A.

In some example embodiments, the first electrode 22A may include a metal material having a higher work function than that of the second electrode 24A. For example, the first electrode 22A may include at least one selected from iridium (Ir), molybdenum (Mo), and molybdenum nitride (MoN). In some example embodiments, the second electrode 24A may include doped polysilicon, a metal such as ruthenium (Ru), titanium (Ti), tantalum (Ta), tungsten (W), etc., a conductive metal nitride such as titanium nitride (TiN), tantalum nitride (TaN), tungsten nitride (WN), etc., and a conductive metal oxide such as iridium oxide. The second electrode 24A may include iridium, molybdenum, or molybdenum oxide.

The first electrode 22A corresponds to a lower electrode of a capacitor structure. The second electrode 24A may correspond to an upper electrode of the capacitor structure. In some example embodiments, the first electrode 22A may correspond to the upper electrode of the capacitor structure, and the second electrode 24A may correspond to the lower electrode of the capacitor structure.

The dielectric layer structure 30A may include the first dielectric layer 32A and the second dielectric layer 34A, wherein the first dielectric layer 32A may be in contact with the entire surface 22AS of the first electrode 22A and the second dielectric layer 34A may be in contact with the second electrode 24A.

In some example embodiments, the first dielectric layer 32A may include zirconium oxide. The first dielectric layer 32A may include zirconium oxide having a tetragonal crystal phase. In an example process of forming the first dielectric layer 32A, the first dielectric layer 32A may be formed by using zirconium oxide on the first electrode 22A including iridium (Ir), molybdenum (Mo), or molybdenum nitride (MoN), and then annealed, such that the first dielectric layer 32A includes iridium, molybdenum, or molybdenum nitride. In an annealing process, the first electrode 22A may function as a crystallization inducing layer for helping zirconium oxide to crystallize in a tetragonal crystal phase. Thus, zirconium oxide in the first dielectric layer 32A in contact with the first electrode 22A may be crystallized to be preferentially oriented in the tetragonal crystal phase. In a comparative example, in the case where the first electrode 22A includes titanium nitride or the like, a dielectric layer formed on titanium nitride may have a cubic crystal phase depending on an interface energy characteristic between zirconium oxide and titanium nitride.

Since the first dielectric layer 32A includes zirconium oxide including the tetragonal crystal phase, the total dielectric constant of the dielectric layer structure 30A may be significantly increased. In general, zirconium oxide including the tetragonal crystal phase may have a relatively higher dielectric constant than that of zirconium oxide including the cubic crystal phase. Thus, the first dielectric layer 32A may have a dielectric constant higher than that of the case where the first dielectric layer 32A includes zirconium oxide including the cubic crystal phase, by about 30% or higher. A relationship between a crystal phase of the first dielectric layer 32A and a dielectric constant is described below with reference to FIGS. 23A to 23C.

In some example embodiments, the second dielectric layer 34A may include at least one of hafnium oxide, aluminum oxide, silicon oxide, titanium oxide, yttrium oxide, scandium oxide, or lanthanide oxide.

In other some example embodiments, the second dielectric layer 34A may be omitted, and the dielectric layer structure 30A may include only the first dielectric layer 32A. In this case, the second dielectric layer 34A may be disposed between the first electrode 22A and the second electrode 24A.

The dielectric layer structure 30A may have a first thickness T1A in the second direction (e.g., a D2 direction in FIG. 2). The first thickness T1A may range from about 30 Å to about 200 Å. The first dielectric layer 32A may have a second thickness T2A in the second direction (e.g., a D2 direction). The second thickness T2A of the first dielectric layer 32A may range from about 60% to about 90% of the first thickness T1A of the dielectric layer structure 30A. For example, the second thickness T2A of the first dielectric layer 32A may range from about 20 Å to about 180 Å. In some example embodiments, the dielectric layer structure 30A may have a dielectric constant of about 40 to about 55, but is not limited thereto.

Generally, in the case where titanium nitride is used as an upper electrode or a lower electrode of a capacitor structure, zirconium oxide may be formed to have the cubic crystal phase on titanium nitride. However, according to the above-described example embodiments, the first electrode 22A may include iridium (Ir), molybdenum (Mo), or molybdenum nitride (MoN) and zirconium oxide having the tetragonal crystal phase may be formed on the first electrode 22A. Generally, the dielectric layer structure 30A may have a high dielectric constant since a dielectric constant of zirconium oxide having the tetragonal crystal phase is higher than that of zirconium oxide having the cubic crystal phase. The semiconductor device 10A according to some example embodiments may have a larger capacitance. Also, the first electrode 22A may include a material having a higher work function than that of titanium nitride, and thus a leakage current may be prevented. Thus, the semiconductor device 10A may have a relatively high capacitance while having a reduced leakage current.

Figure 23A:
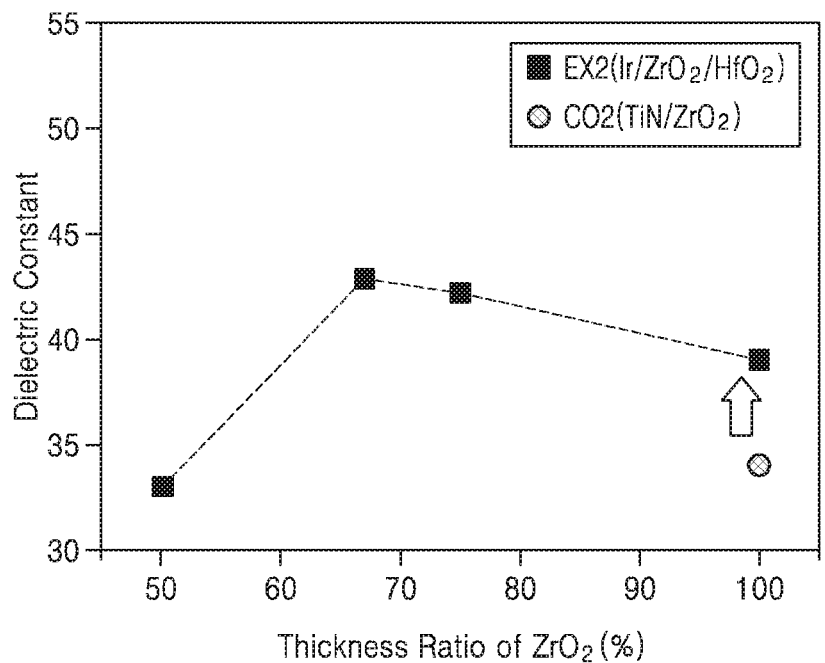
FIG. 23A is a graph showing dielectric constants of capacitor structures according to an experimental example group and a comparative example group.
Figure 23B:
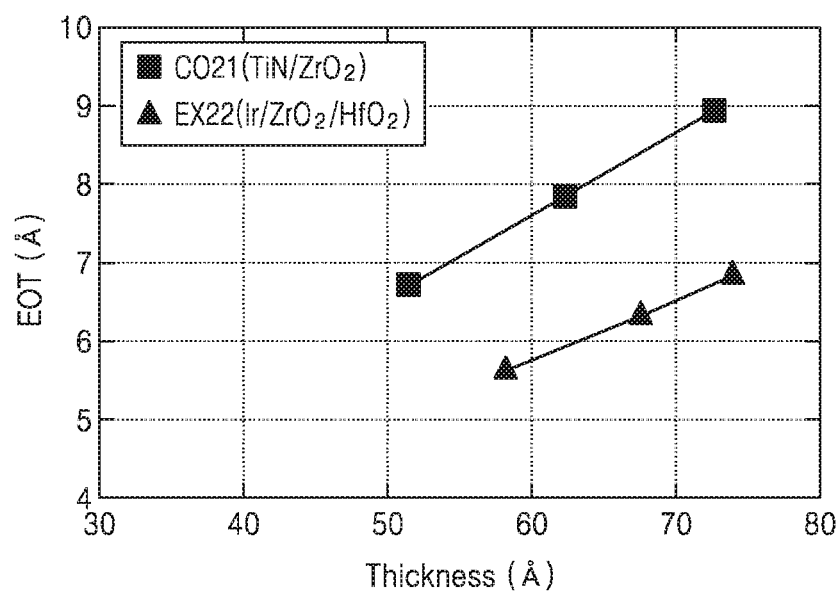
FIG. 23B is a graph showing equivalent oxide thicknesses of capacitor structures according to comparative examples and an experimental example.
Figure 23C:
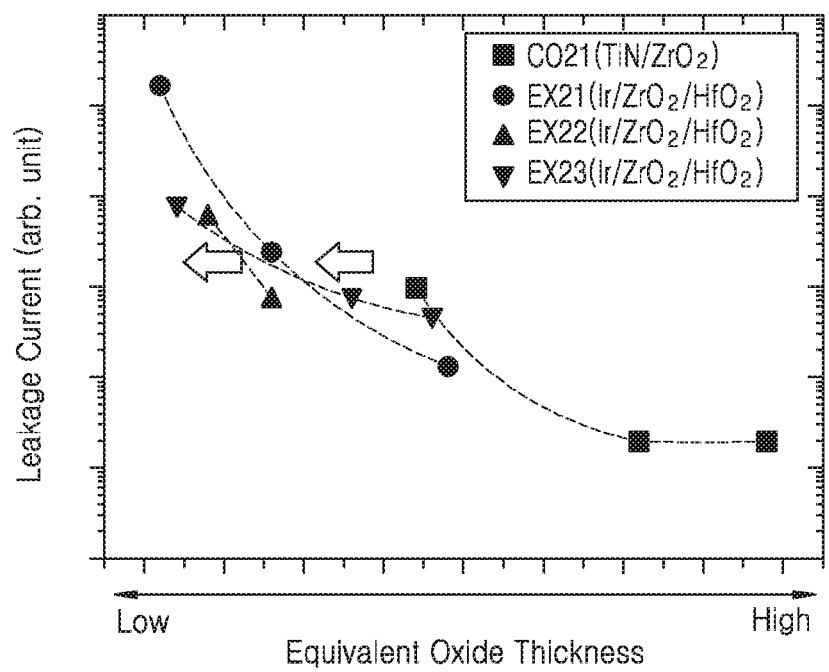
FIG. 23C is a graph showing a leakage current of capacitor structures according to comparative examples and an experimental example as a function of an equivalent oxide thickness.

Hereinafter, dielectric constants of capacitor structures according to some example embodiments will be described with reference to FIGS. 23A to 23C in comparison with a capacitor structure according to a comparative example. In FIGS. 23A to 23C, with respect to a capacitor structure according to experimental example group EX2 in which the first electrode 22A includes iridium and a capacitor structure according to a comparative example group CO2 in which the first electrode 22A includes titanium nitride, dielectric constants and leakage current are measured.

FIG. 23A is a graph showing a dielectric constant relative to a thickness ratio of zirconium oxide (or a dielectric constant according to content of the first dielectric layer 32A) with respect to the capacitor structure according to the experimental example group EX2 and the capacitor structure according to the comparative example group CO2.

For the capacitor structure according to the experimental example group EX2, the dielectric layer structure 30A is formed on the first electrode 22A including iridium, and the dielectric layer structure 30A is formed to include the first dielectric layer 32A including zirconium oxide and the second dielectric layer 34A including hafnium oxide. Experimental examples 5 to 7 EX21, EX22, and EX23 correspond to capacitor structures in which a thickness of the first dielectric layer 32A is about 67%, about 75%, and 100%, respectively. For the capacitor structure according to the comparative example group CO2, the dielectric layer structure 30A is formed on the first electrode 22A including titanium nitride, and the dielectric layer structure 30A is formed to include only the first dielectric layer 32A including zirconium oxide. That is, comparative example 4 CO21 corresponds to a capacitor structure in which the thickness of the first dielectric layer 32A is 100%.

In FIG. 23A, the X axis is a ratio of the second thickness T2A of the first dielectric layer 32A relative to the first thickness T1A of the dielectric layer structure 30A, which corresponds to content of zirconium oxide included in the entire dielectric layer structure 30A or the volume of the first dielectric layer 32A relative to the total volume of the dielectric layer structure 30A.

Referring to FIG. 23A, it may be seen that experimental example 7 EX23 has a dielectric constant higher than that of comparative example 4 CO21 and that zirconium oxide formed on iridium has a dielectric constant higher than zirconium oxide formed on titanium nitride. It may be understood that zirconium oxide is crystallized to have a tetragonal crystal phase on the first electrode 22A including iridium, and zirconium oxide having the tetragonal crystal phase has a dielectric constant higher than that of zirconium oxide having a cubic crystal phase. Also, experimental example 5 EX21 and experimental example 6 EX22 have dielectric constants higher than those of comparative example 4 CO21 and experimental example 7 EX23. It may be seen that the first dielectric layer 32A has the best dielectric constant when a thickness ratio of the first dielectric layer 32A is in the range of about 60% to about 90%.

FIG. 23B is a graph showing equivalent oxide thicknesses of comparative example 4 CO21 and experimental example 6 EX22 in FIG. 23A as a function of a layer thickness. FIG. 23C is a graph showing leakage current of comparative examples 4 CO21 and experimental examples 5 to 7 EX21, EX22 and EX23 as a function of the equivalent oxide thickness.

Referring to FIG. 23B, a dielectric constant of about 38 may be obtained from the graph of comparative example 4 CO21, while a dielectric constant of about 51 may be obtained from the graph of experimental example 6 EX22. That is, the capacitor structure according to experimental example 6 EX22 including 75% of zirconium oxide and 25% of hafnium oxide formed on iridium has a dielectric constant that is increased by about 30% or more as compared with comparative example 4 CO21 including 100% of zirconium oxide formed on titanium nitride.

Referring to FIG. 23C, as shown by arrows, experimental examples 5 to 7 EX21, EX22, and EX23 show leakage current reduced even at a small equivalent oxide thickness as compared with comparative example 4 CO21. As described above, it can be considered that the leakage current of the capacitor structure is reduced since the first electrode 22A includes a material having a higher work function than that of the second electrode 24A.

Figure 3:
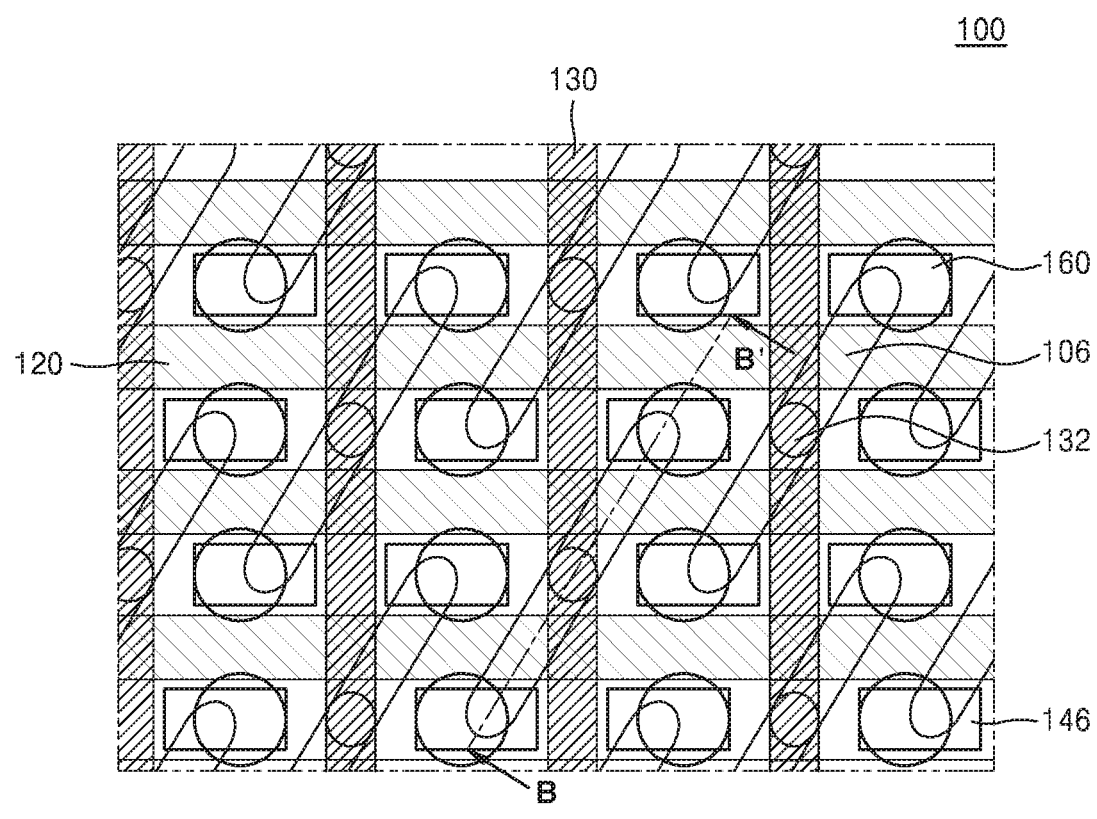
FIG. 3 is a layout view showing a semiconductor device according to some example embodiments.
Figure 4:
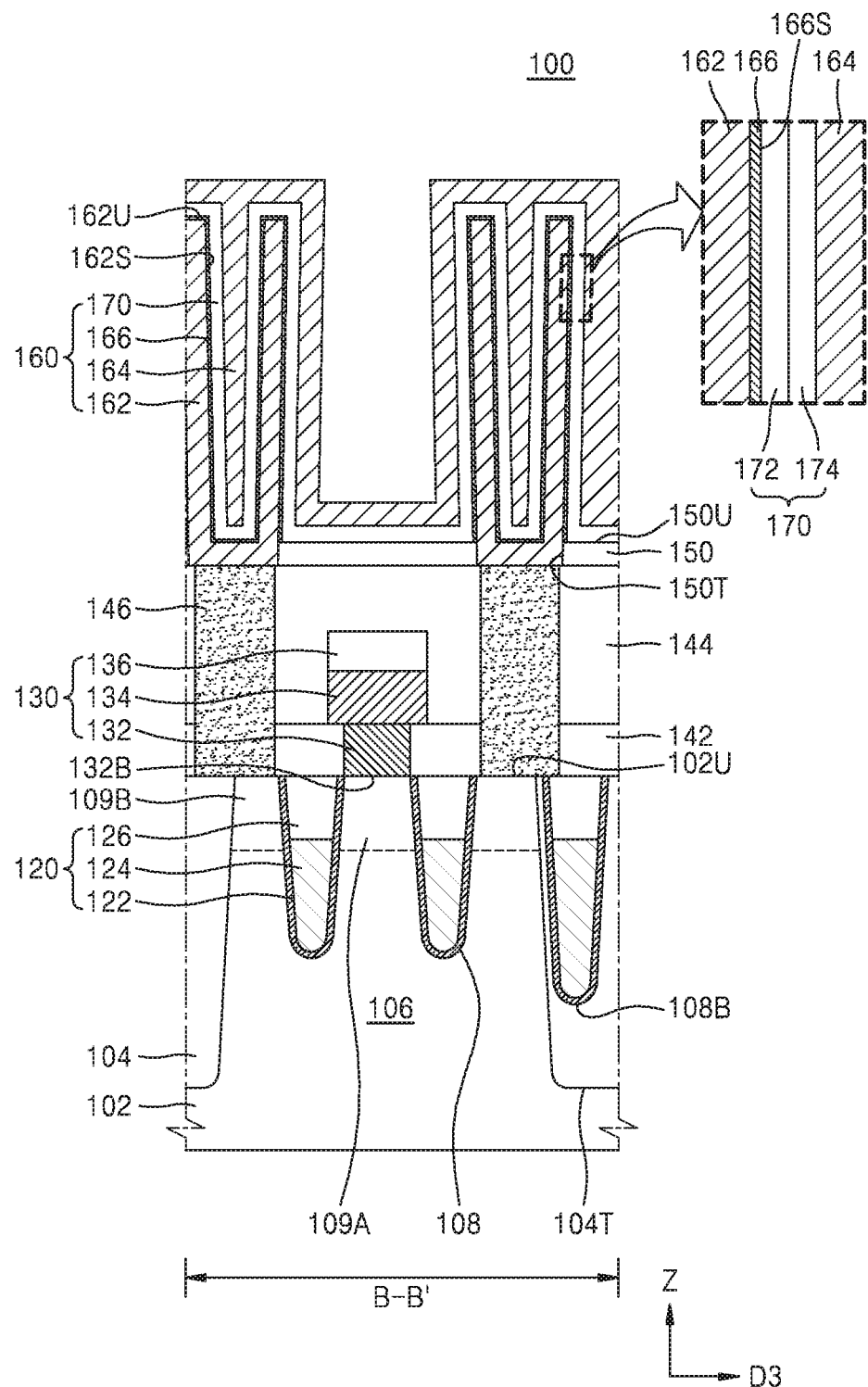
FIG. 4 is a cross-sectional view taken along a line B-B' in FIG. 3.

FIG. 3 is a layout view showing a semiconductor device 100 according to some example embodiments. FIG. 4 is a cross-sectional view taken along a line B-B' in FIG. 3.

Referring to FIGS. 3 and 4, a substrate 102 may include an active region 106 defined by an isolation layer 104. In some example embodiments, the substrate 102 may include a semiconductor material such as silicon (Si), germanium (Ge), or silicon germanium (SiGe), silicon carbide (SiC), gallium arsenide (GaAs), indium arsenide (InAs), or indium phosphide (InP). In some example embodiments, the substrate 102 may include a conductive region, for example, a well doped with an impurity, or a structure doped with an impurity.

The isolation layer 104 may have a shallow trench isolation (STI) structure. For example, the isolation layer 104 may include an insulating material filling an isolation trench 104T formed in the substrate 102. The insulating material may include fluoride silicate glass (FSG), undoped silicate glass (USG), borophosphosilicate glass (BPSG), phosphosilicate glass (PSG), flowable oxide (FOX), plasma enhanced tetra-ethyl-ortho-silicate (PE-TEOS), or tonen silazene (TOSZ) but is not limited thereto.

The active region 106 may have a relatively long island shape, each having a minor axis and a major axis. As shown in FIG. 3, for example, the major axis of the active region 106 may be arranged in a direction (e.g. a D3 direction in FIG. 3) parallel to an upper surface 102U of the substrate 102. In some example embodiments, the active region 106 may have a first conductivity type. The first conductivity type may be P-type or N-type.

The substrate 102 may further include gate line trenches 108 extending in an X direction parallel to the upper surface 102U of the substrate 102. The gate line trenches 108 may intersect the active region 106 and may be formed from the upper surface 102U of the substrate 102 at a particular (or, in some example embodiments, predetermined) depth. A part of each of the gate line trenches 108 may extend into the isolation layer 104. The part of each of the gate line trenches 108 formed in the isolation layer 104 may include a bottom surface 108B located at a lower level than a part of each of the gate line trenches 108 formed in the active region 106.

A first source/drain region 109A and a second source/drain region 109B may be disposed in an upper portion of the active region 106 located on both sides of each of the gate line trenches 108. The first source/drain region 109A and the second source/drain region 109B may be an impurity region doped with an impurity having a second conductivity type different from the first conductivity type. The second conductivity type may be N-type or P-type.

A gate structure 120 may be formed in each of the gate line trenches 108. The gate structure 120 may include a gate insulating layer 122, a gate electrode 124, and a gate capping layer 126 sequentially formed on an inner wall of each of the gate line trenches 108.

The gate insulating layer 122 may be conformally formed on the inner wall of each of the gate line trenches 108 at a particular (or, in some example embodiments, predetermined) thickness. The gate insulating layer 122 may include at least one material selected from silicon oxide, silicon nitride, silicon oxynitride, oxide/nitride/oxide (ONO), and a high-k dielectric material having a dielectric constant higher than that of silicon oxide. For example, the gate insulating layer 122 may have a dielectric constant from about 10 to about 25. In some embodiments, the gate insulating layer 122 may include HfO2, Al2O3, HfAlO3, Ta2O3, TiO2, or a combination thereof, but is not limited to these examples.

The gate electrode 124 may be formed on the gate insulating layer 122 to fill the gate line trenches 108 from a bottom portion of each of the gate line trenches 108 to a particular (or, in some example embodiments, predetermined) height. The gate electrode 124 may include a work function control layer (not shown) disposed on the gate insulating layer 122 and a burial metal layer (not shown) filling the bottom portion of each of the gate line trenches 108 on the work function control layer. For example, the work function control layer may include a metal such as Ti, TiN, TiAlN, TiAlC, TiAlCN, TiSiCN, Ta, TaN, TaAlN, TaAlCN, TaSiCN, a metal nitride or a metal carbide. The burial metal layer may include at least one of W, WN, TiN, and TaN.

The gate capping layer 126 may fill a remaining portion of each of the gate line trenches 108 on the gate electrode 124. For example, the gate capping layer 126 may include at least one of silicon oxide, silicon oxynitride, and silicon nitride.

A bit line structure 130 may be formed on the first source/drain region 109A and may extend parallel to the upper surface 102U of the substrate 102 in a Y direction perpendicular to an X direction. The bit line structure 130 may include a bit line contact 132, a bit line 134, and a bit line capping layer 136 that are sequentially stacked on the substrate 102. For example, the bit line contact 132 may include polysilicon and the bit line 134 may include a metal material. The bit line capping layer 136 may include an insulating material such as silicon nitride or silicon oxynitride. Although the bit line contact 132 is formed to have a bottom surface 132B at the same level as the upper surface 102U of the substrate 102 in FIG. 4, the bottom surface 132B of the bit line contact 132 may be formed lower than the upper surface 102U of the substrate 102.

In some example embodiments, a bit line intermediate layer (not shown) may be disposed between the bit line contact 132 and the bit line 134. The bit line intermediate layer may include a metal silicide such as tungsten silicide, or a metal nitride such as tungsten nitride. A bit line spacer (not shown) may be further formed on a sidewall of the bit line structure 130. The bit line spacer may have a single layer structure or a multilayer structure including an insulating material such as silicon oxide, silicon oxynitride, or silicon nitride. Also, the bit line spacer may further include an air space (not shown).

A first insulating interlayer 142 may be formed on the substrate 102. A bit line contact 132 may be connected to the first source/drain region 109A through the first insulating interlayer 142. A bit line 134 and a bit line capping layer 136 may be disposed on the first insulating interlayer 142. A second insulating interlayer 144 may be disposed on the first insulating interlayer 142 to cover side surfaces and upper surfaces of the bit line 134 and the bit line capping layer 136.

The contact structure 146 may be disposed on the second source/drain region 109B, and thus may be on the substrate 102. The first and second insulating interlayers 142 and 144 may surround a sidewall of the contact structure 146. In some example embodiments, the contact structure 146 may include a lower contact pattern (not shown), a metal silicide layer (not shown), and an upper contact pattern (not shown) that are sequentially stacked on the substrate 102 and a barrier layer (not shown) surrounding side and bottom surfaces of the upper contact pattern. In some example embodiments, the lower contact pattern may include polysilicon, and the upper contact pattern may include a metal material. The barrier layer may include a metal nitride having conductivity.

A capacitor structure 160 may be formed on the second insulating interlayer 144. As shown in FIG. 4, the capacitor structure 160 may be on the contact structure 146. The capacitor structure 160 may include a lower electrode 162 that is in electrical contact with ("electrically connected to") the contact structure 146, a crystallization inducing layer 166 on the lower electrode 162, a dielectric layer structure 170 on the crystallization inducing layer 166, and an upper electrode 164 on the dielectric layer structure 170 (and thus on the substrate 102). The upper electrode 164 may include a metal material that has a work function that is greater than a work function of titanium nitride. An etch stop layer 150 having an opening 150T may be formed on the second insulating interlayer 144. A bottom portion of the lower electrode 162 may be disposed in the opening 150T of the etch stop layer 150. The lower electrode 162 may include a metal material that has a work function greater than a work function of titanium nitride.

In FIGS. 3 and 4, the capacitor structure 160 is repeatedly arranged in the X direction and the Y direction on the contact structure 146 arranged repeatedly in the X direction and the Y direction. However, unlike that shown in FIGS. 3 and 4, the capacitor structure 160 may be arranged in a hexagonal shape such as a honeycomb structure on the contact structure 146 repeatedly arranged in the X direction and Y direction. In this case, a landing pad (not shown) may be further formed between the contact structure 146 and the capacitor structure 160.

The lower electrode 162 may be formed on the contact structure 146 (and thus may be on the substrate 102). The lower electrode 162 may have a cylinder shape having a closed bottom or a cup shape. The crystallization inducing layer 166 may be conformally formed on an uppermost surface 162U and a sidewall 162S of the lower electrode 162. The crystallization inducing layer 166 may not be formed on an upper surface 150U of the etch stop layer 150, as shown in FIG. 4.

The dielectric layer structure 170 may be formed on the crystallization inducing layer 166 and the etch stop layer 150 (and thus may be on the substrate 102 and may be on the lower electrode 162). The dielectric layer structure 170 may include a first dielectric layer 172 in direct contact with the crystallization inducing layer 166 and a second dielectric layer 174 in contact with the upper electrode 164 on the first dielectric layer 172. Restated, and as shown in FIG. 4, the dielectric layer structure 170 may be between the lower electrode 162 and the upper electrode 164, and the crystallization inducing layer 166 may be between the dielectric layer structure 170 and the lower electrode 162, where the dielectric layer structure 170 includes a first dielectric layer that includes a first dielectric material and a second dielectric layer 174 on the first dielectric layer 172, where the second dielectric layer 174 includes a second dielectric material. As shown in FIG. 4, the first dielectric layer 172 may be on a surface 166S of the crystallization inducing layer 166, and the crystallization inducing layer 166 and the first dielectric layer 172 may be in contact with each other.

The crystallization inducing layer 166 between the lower electrode 162 and the first dielectric layer 172 may include a metal material, and the metal material may have a work function that is higher ("greater") than a work function of titanium nitride.

For detailed descriptions of the lower electrode 162, the upper electrode 164, the crystallization inducing layer 166, and the dielectric layer structure 170, descriptions of the first electrode 22, the second electrode 24, the crystallization inducing layer 26, and the dielectric layer structure 30, respectively provided above with reference to FIG. 1 may be referred to.

In some example embodiments, the dielectric layer structure 170 includes at least one material of hafnium oxide having a tetragonal crystal phase, or zirconium oxide having the tetragonal crystal phase.

According to the semiconductor device 100 according to some example embodiments, the first dielectric layer 172 may be crystallized as hafnium oxide having a tetragonal crystal phase due to the crystallization inducing layer 166, and thus the capacitor structure 160 may have a relatively high capacitance. Restated, the first dielectric material of the first dielectric layer 172 may include hafnium oxide having a tetragonal crystal phase, such that the first dielectric layer 172 may include zirconium oxide having a tetragonal crystal phase.

Figure 5:
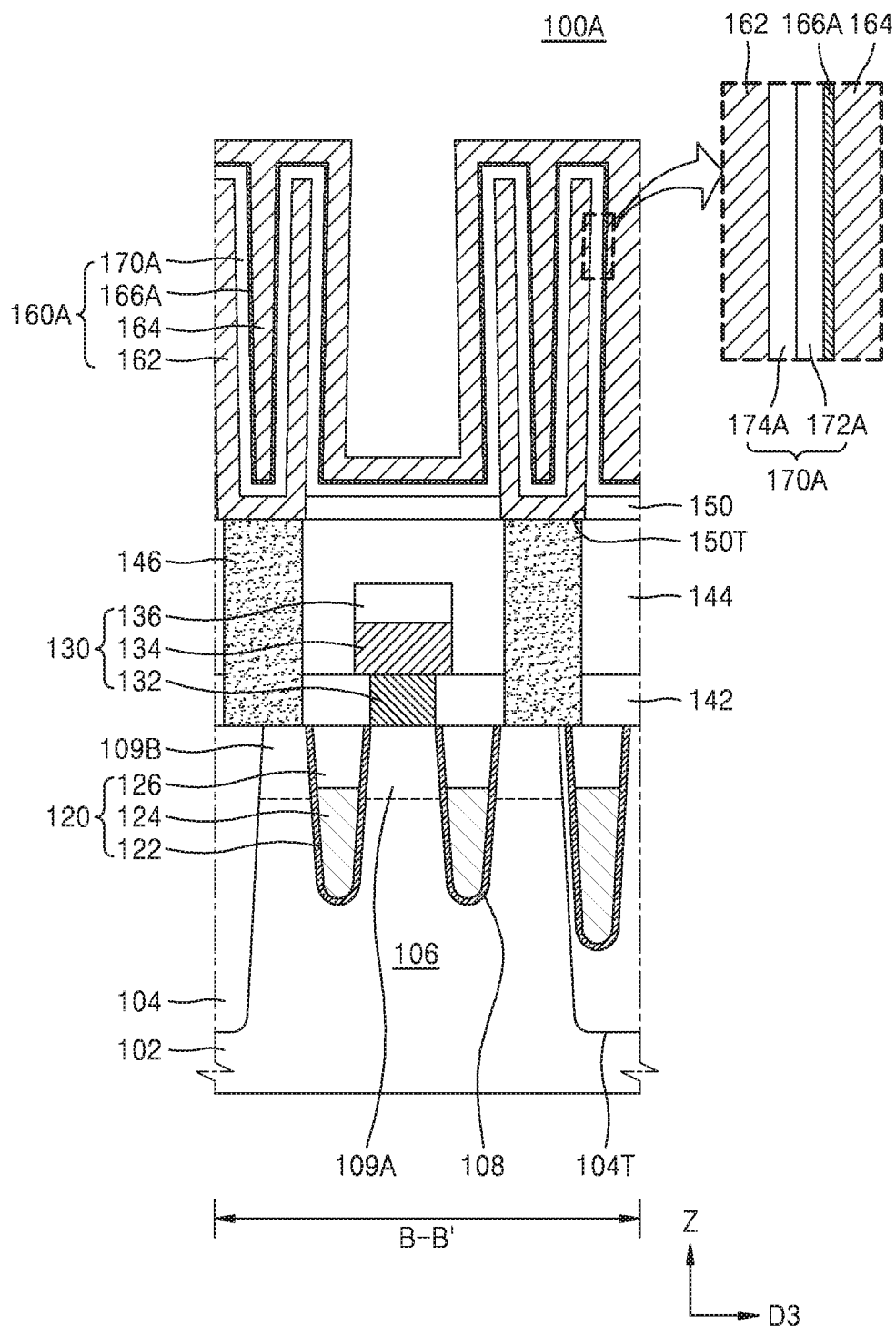
FIG. 5 is a cross-sectional view showing a semiconductor device according to some example embodiments.

FIG. 5 is a cross-sectional view showing a semiconductor device 100A according to some example embodiments. FIG. 5 is a cross-sectional view taken along the line B-B' in FIG. 3. In FIG. 5, the same reference numerals as in FIGS. 1 to 4 denote the same components.

Referring to FIG. 5, a capacitor structure 160A may include a crystallization inducing layer 166A formed between a dielectric layer structure 170A and the upper electrode 164 (e.g., a second electrode). The dielectric layer structure 170A may include a first dielectric layer 172A in direct contact with the crystallization inducing layer 166A and a second dielectric layer 174A in contact with the lower electrode 162 on the first dielectric layer 172A. The first dielectric layer 172A may include hafnium oxide having a tetragonal crystal phase. The crystallization inducing layer 166A may be disposed in contact with the dielectric layer structure 170A between the lower electrode 162 and the upper electrode 164 and also on the dielectric layer structure 170A disposed on the etch stop layer 150.

In an example manufacturing process of the capacitor structure 160A, after the second dielectric layer 174A may be conformally formed on the lower electrode 162 and then the first dielectric layer 172A may be formed on the second dielectric layer 174A, the crystallization inducing layer 166A and the upper electrode 164 may be formed on the first dielectric layer 172A. Thereafter, when an annealing process is performed, the first dielectric layer 172A in contact with the crystallization inducing layer 166A may be crystallized to have the tetragonal crystal phase.

According to the semiconductor device 100A according to some example embodiments, the first dielectric layer 172A may be crystallized to hafnium oxide having the tetragonal crystal phase due to the crystallization inducing layer 166A, and thus the capacitor structure 160A may have a relatively high capacitance.

In some example embodiments, including the example embodiments shown in FIG. 5, the first dielectric layer 172A may be referred to as a "second dielectric layer." In addition, the crystallization inducing layer 166 between the upper electrode 164 and the second dielectric layer (e.g., the first dielectric layer 172A) may include a metal material, where the metal material has a work function that is greater than a work function of titanium nitride.

Figure 6:
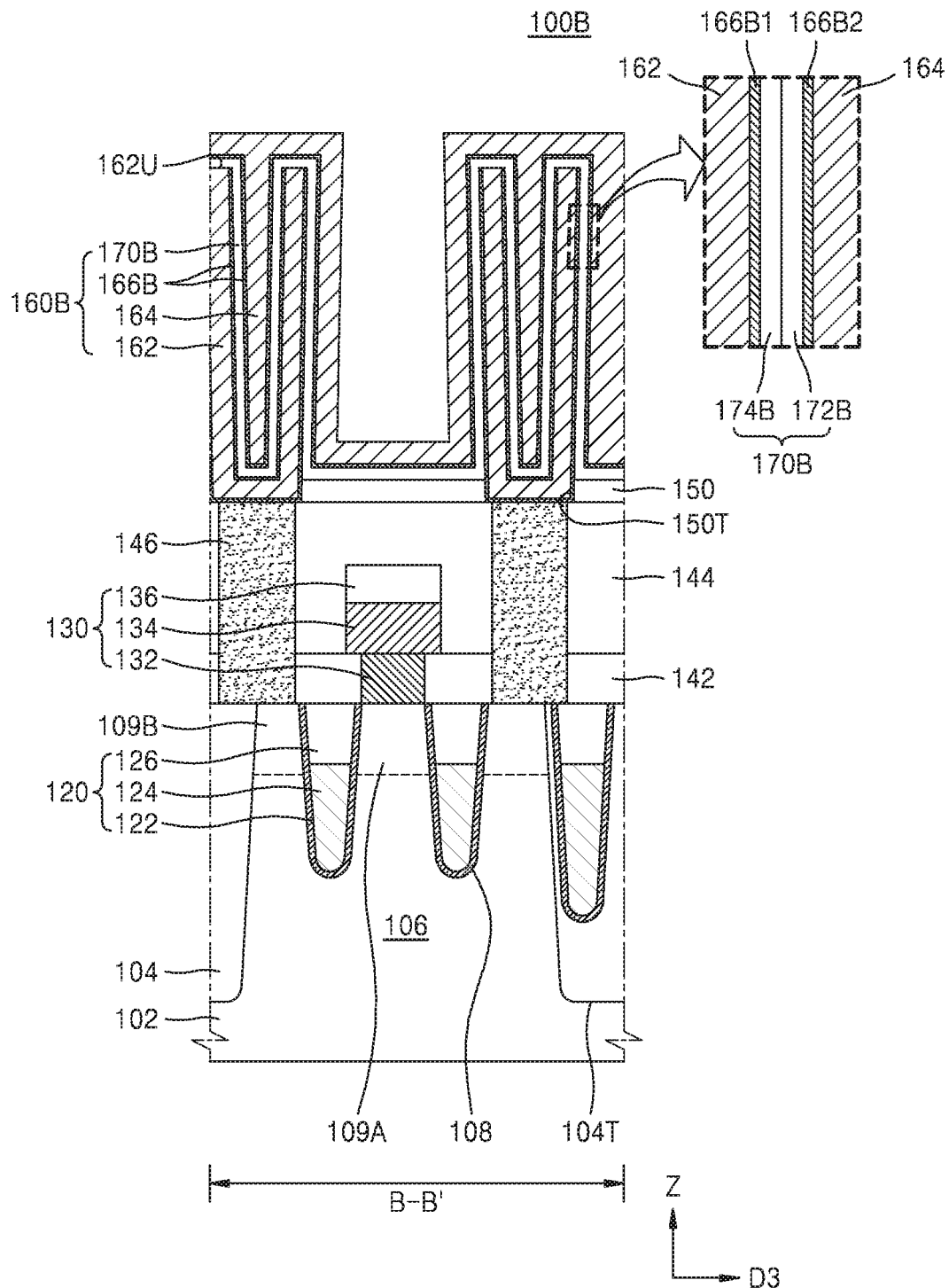
FIG. 6 is a cross-sectional view showing a semiconductor device according to some example embodiments.

FIG. 6 is a cross-sectional view showing a semiconductor device 100B according to some example embodiments. FIG. 6 is a cross-sectional view taken along the line B-B' in FIG. 3. In FIG. 6, the same reference numerals as in FIGS. 1 to 5 denote the same components.

Referring to FIG. 6, a capacitor structure 160B may include a crystallization inducing layer 166B between a dielectric layer structure 170B and the upper electrode 164 (second electrode) and further between the dielectric layer structure 170B and the lower electrode 162 (first electrode).

A first portion 166B1 of the crystallization inducing layer 166B may be disposed to surround a side wall of the lower electrode 162 and disposed between the etch stop layer 150 and the lower electrode 162 and between the lower electrode 162 and the contact structure 146. A second portion 166B2 of the crystallization inducing layer 166B may be disposed between the first dielectric layer 172B and the upper electrode 164. The first dielectric layer 172B may include hafnium oxide having a tetragonal crystal phase.

The second dielectric layer 174B may be disposed on the lower electrode 162 with the first portion 166B1 of the crystallization inducing layer 166B therebetween. The second dielectric layer 174B may include at least one of a dielectric material, the dielectric material being different from that of the first dielectric layer 172B, such as zirconium oxide, aluminum oxide, silicon oxide, titanium oxide, yttrium oxide, scandium oxide, and lanthanide oxide.

In an example manufacturing process of the capacitor structure 160B, a first layer of the crystallization inducing layer 166B may be formed before the lower electrode 162 is formed in an opening 210H of a mold layer 210 (see FIG. 15), the lower electrode 162 may be formed on the crystallization inducing layer 166B, and a second layer of the crystallization inducing layer 166B may be formed on the lower electrode 162. Accordingly, both an inner wall and an outer wall of the lower electrode 162 may be surrounded by the crystallization inducing layer 166B. Then, after the mold layer 210 is removed, the dielectric layer structure 170 may be formed and the second portion 166B2 of the crystallization inducing layer 166B may be formed on the dielectric layer structure 170.

In FIG. 6, the first portion 166B1 of the crystallization inducing layer 166B is not formed on the uppermost surface 162U of the lower electrode 162 and the uppermost surface 162U of the lower electrode 162 is in contact with the second dielectric layer 174B but is not limited thereto. Unlike that shown in FIG. 6, the first portion 166B1 of the crystallization inducing layer 166B may be disposed between the uppermost surface 162U of the lower electrode 162 and the second dielectric layer 174B. As shown in FIG. 6, the second dielectric layer 174B may be in contact with the crystallization inducing layer 166 (e.g., the first portion 166B1 of the crystallization inducing layer 166B).

The crystallization inducing layer 166B may be between the dielectric layer structure 170B and the lower electrode 162 and between the dielectric layer structure 170B and the upper electrode 164 and the crystallization inducing layer 166B include a metal material having work function material that is higher ("greater") than that of the lower and upper electrodes 162 and 164, and thus the capacitor structure 160B may have a reduced leakage current.

Figure 7:
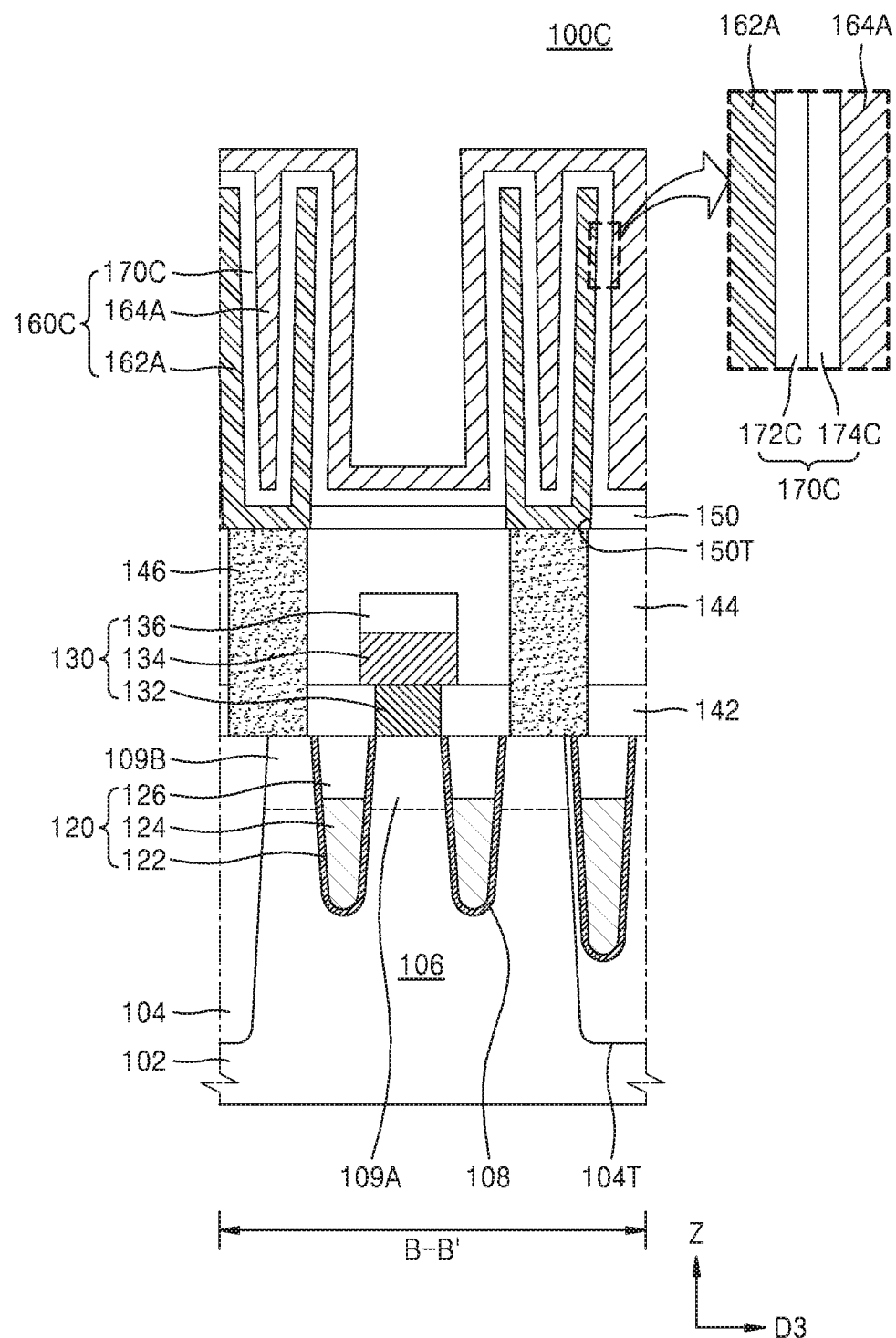
FIG. 7 is a cross-sectional view showing a semiconductor device according to some example embodiments.

FIG. 7 is a cross-sectional view showing a semiconductor device 100C according to some example embodiments. FIG. 7 is a cross-sectional view taken along the line B-B' in FIG. 3. In FIG. 7, the same reference numerals as in FIGS. 1 to 6 denote the same components.

Referring to FIG. 7, a capacitor structure 160C may include a lower electrode 162A, a dielectric layer structure 170C on the lower electrode 162A, and an upper electrode 164A on the dielectric layer structure 170C. The dielectric layer structure 170C may include a first dielectric layer 172C conformally formed on the lower electrode 162A, in contact with the lower electrode 162A, and a second dielectric layer 174C formed on the first dielectric layer 172C and in contact with the upper electrode 164A. For detailed descriptions of the lower electrode 162A, the upper electrode 164A and the dielectric layer structure 170C, descriptions of the first electrode 22A, the second electrode 24A and the dielectric layer structure 30A provided above with reference to FIG. 2 may be referred.

According to the semiconductor device 100C according to some example embodiments, the first dielectric layer 172C may be crystallized to zirconium oxide having a tetragonal crystal phase by the lower electrode 162A including iridium, molybdenum, or molybdenum nitride, and thus the capacitor structure 160C may have a relatively high capacitance. Restated, the lower electrode 162A may include at least one of iridium, molybdenum, or molybdenum nitride, and the first dielectric layer may include zirconium oxide having a tetragonal crystal phase.

Figure 8:
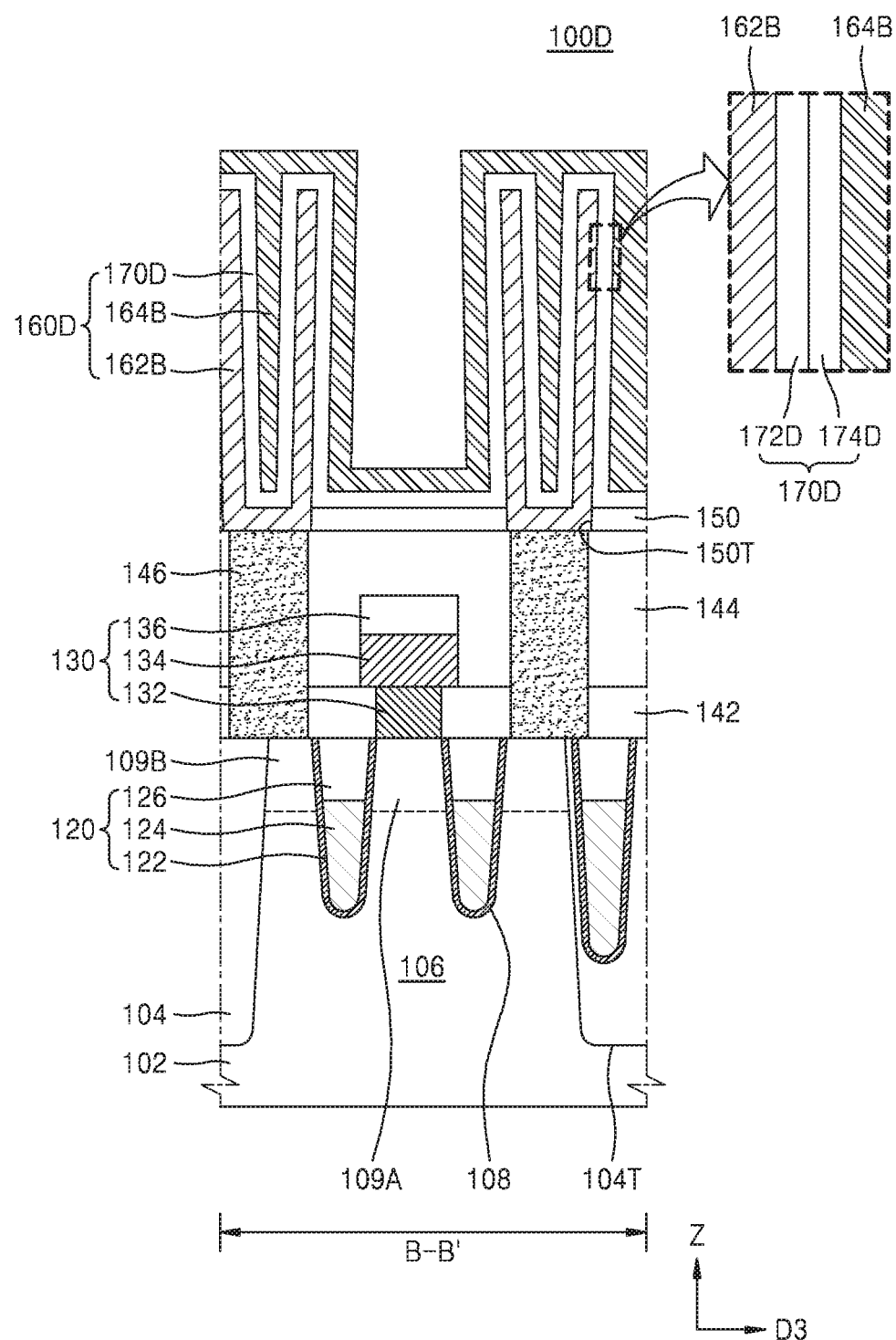
FIG. 8 is a cross-sectional view showing a semiconductor device according to some example embodiments.

FIG. 8 is a cross-sectional view showing a semiconductor device 100D according to some example embodiments. FIG. 8 is a cross-sectional view taken along the line B-B' in FIG. 3. In FIG. 8, the same reference numerals as in FIGS. 1 to 7 denote the same components.

Referring to FIG. 8, a capacitor structure 160D may include a lower electrode 162B, a dielectric layer structure 170D on the lower electrode 162B, and an upper electrode 164B on the dielectric layer structure 170D. The lower electrode 162B may have a characteristic similar to that of the second electrode 24A described with reference to FIG. 2. The upper electrode 164B may have a characteristic similar to that of the first electrode 22A described with reference to FIG. 2. The dielectric layer structure 170D may include a second dielectric layer 174D in contact with the upper electrode 164B and a first dielectric layer 172D in contact with the lower electrode 162B. That is, the upper electrode 164B may include iridium, molybdenum, or molybdenum nitride, and the first dielectric layer 172D in contact with the upper electrode 164B may include zirconium oxide having a tetragonal crystal phase.

In an example manufacturing process of the capacitor structure 160D, after the second dielectric layer 174D may be formed conformally on the lower electrode 162B and then the first dielectric layer 172D may be formed on the second dielectric layer 174D, the upper electrode 164B may be formed on the first dielectric layer 172D. Thereafter, when an annealing process is performed, the first dielectric layer 172D in contact with the upper electrode 164B may be crystallized to have a tetragonal crystal phase.

According to the semiconductor device 100D according to some example embodiments, the first dielectric layer 172D may be crystallized to zirconium oxide having the tetragonal crystal phase by the upper electrode 164B, and thus the capacitor structure 160D may have a relatively high capacitance.

Figure 9:
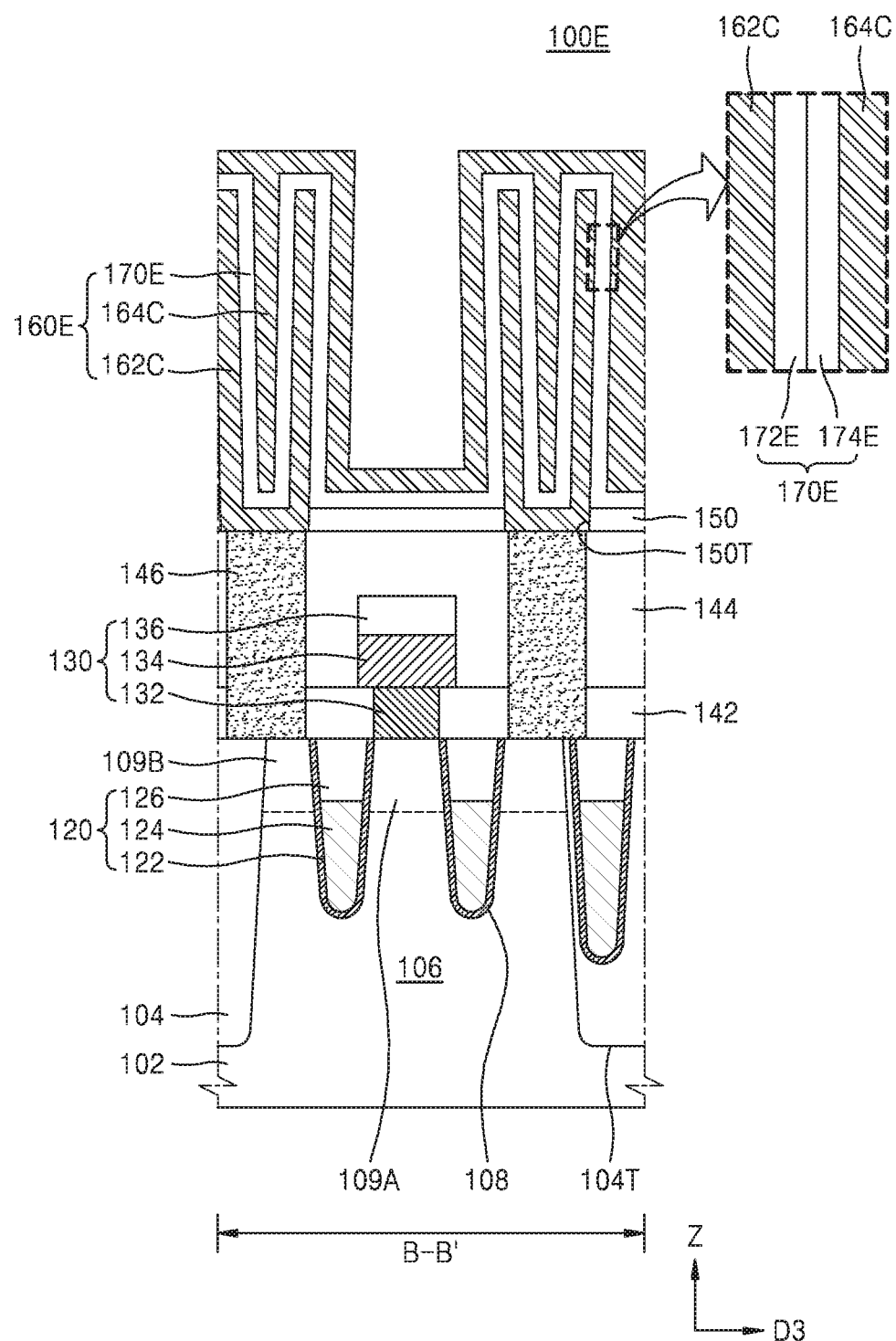
FIG. 9 is a cross-sectional view showing a semiconductor device according to some example embodiments.

FIG. 9 is a cross-sectional view showing a semiconductor device 100E according to some example embodiments. FIG. 9 is a cross-sectional view taken along the line B-B' in FIG. 3. In FIG. 9, the same reference numerals as in FIGS. 1 to 8 denote the same components.

Referring to FIG. 9, a capacitor structure 160E may include a lower electrode 162C, a dielectric layer structure 170E on the lower electrode 162C, and an upper electrode 164C on the dielectric layer structure 170E. Both the lower electrode 162C and the upper electrode 164C may include iridium, molybdenum, or molybdenum nitride. In some example embodiments, the first dielectric layer 172E in contact with the lower electrode 162C may include zirconium oxide having a tetragonal crystal phase and the second dielectric layer 174E may include a material different from that of the first dielectric layer 172E, for example, at least one of hafnium oxide, aluminum oxide, silicon oxide, titanium oxide, yttrium oxide, scandium oxide, and lanthanide oxide. In other embodiments, the second dielectric layer 174E in contact with the upper electrode 164C may include zirconium oxide having the tetragonal crystal phase and the first dielectric layer 172E may include a material different from that of the second dielectric layer 174E.

In some example embodiments, the capacitor structure 160E may have a reduced leakage current since both the lower electrode 162C and the upper electrode 164C include materials having a higher work function than that of titanium nitride.

Figure 10:
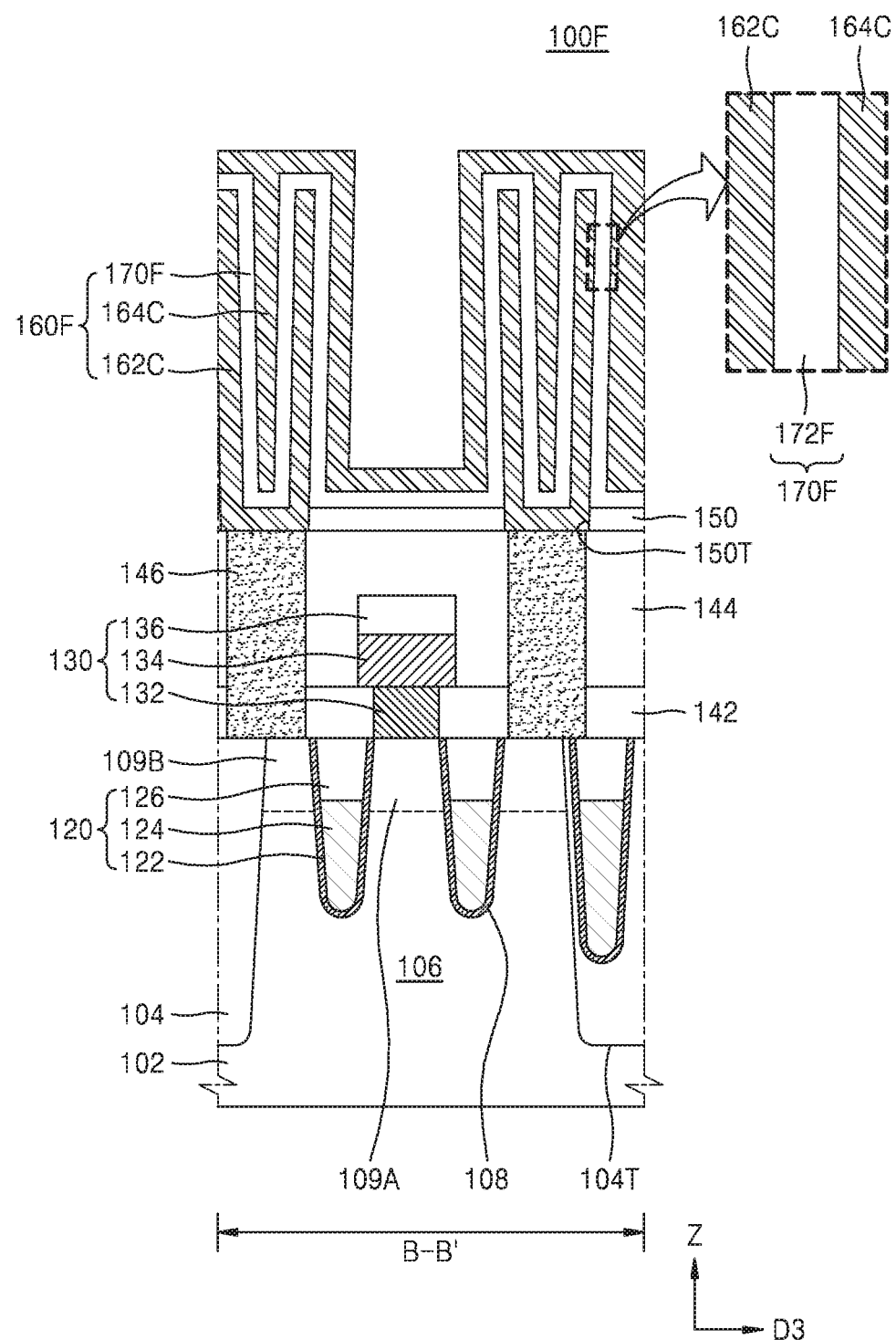
FIG. 10 is a cross-sectional view showing a semiconductor device according to some example embodiments.

FIG. 10 is a cross-sectional view showing a semiconductor device 100F according to some example embodiments. FIG. 10 is a cross-sectional view taken along the line B-B' in FIG. 3. In FIG. 10, the same reference numerals as in FIGS. 1 to 9 denote the same components.

Referring to FIG. 10, a capacitor structure 160F may include a dielectric layer structure 170F formed as a single layer of a first dielectric layer 172F. The first dielectric layer 172F may be formed in contact with both the lower electrode 162C and the upper electrode 164C. The first dielectric layer 172F may include zirconium oxide having a tetragonal crystal phase.

In some example embodiments, after the first dielectric layer 172F is formed on the lower electrode 162C, the upper electrode 164C may be formed on the first dielectric layer 172F, and then annealed. In an annealing process, the first dielectric layer 172F may be crystallized to the tetragonal crystal phase by the lower electrode 162C and the upper electrode 164C.

In some example embodiments, the first dielectric layer 172F may be crystallized to zirconium oxide having the tetragonal crystal phase, and thus the capacitor structure 160F may have a relatively high capacitance. Also, since the lower electrode 162C and the upper electrode 164C both include a material having a higher work function than that of titanium nitride, the capacitor structure 160F may have a reduced leakage current.

Figure 11:
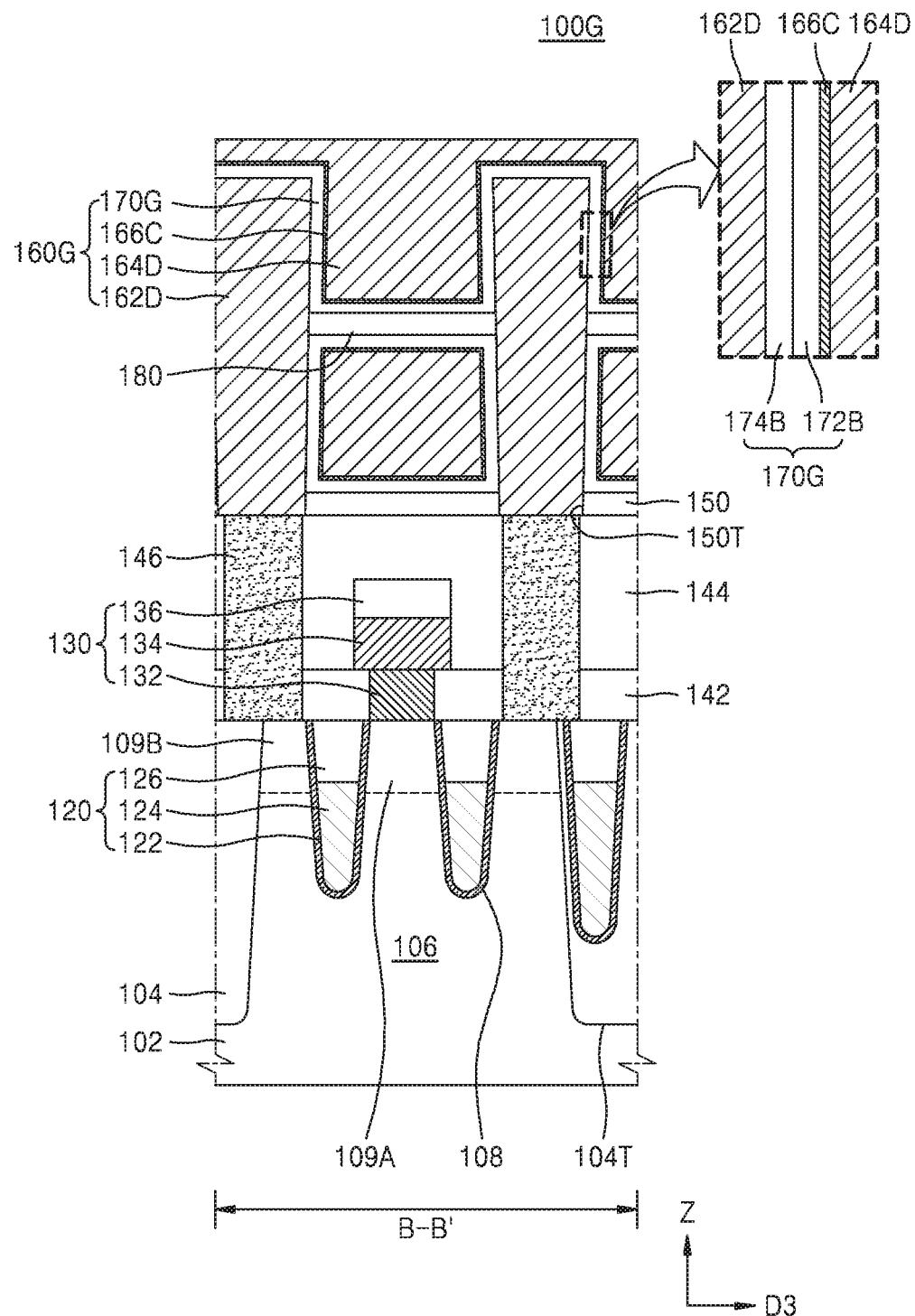
FIG. 11 is a cross-sectional view showing a semiconductor device according to some example embodiments.

FIG. 11 is a cross-sectional view sequentially illustrating a semiconductor device 100G according to some example embodiments. FIG. 11 is a cross-sectional view taken along the line B-B' in FIG. 3. In FIG. 11, the same reference numerals as in FIGS. 1 to 10 denote the same components.

A capacitor structure 160G may include a lower electrode 162D of a pillar shape. A support member 180 for preventing the lower electrode 162D from falling down may be disposed on a part of a side wall of the lower electrode 162D. A dielectric layer structure 170G may be conformally formed on the lower electrode 162D and the support member 180. The upper electrode 164D may be disposed on the dielectric layer structure 170G to fill a space between the lower electrode 162D and a neighboring lower electrode 162D. A crystallization inducing layer 166C may be formed between the dielectric layer structure 170G and the upper electrode 164D. The first dielectric layer 172B may be in contact with the crystallization inducing layer 166C.

FIGS. 12 to 17 are cross-sectional views illustrating a method of manufacturing the semiconductor device 100 according to some example embodiments.

Figure 12:
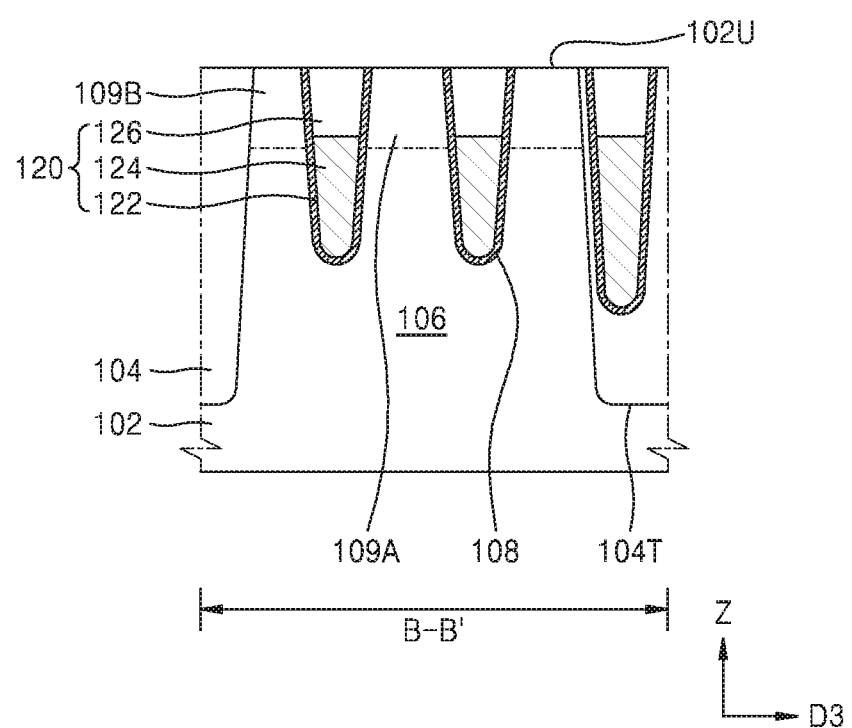
FIGS. 12, 13, 14, 15, 16, and 17 are cross-sectional views sequentially illustrating a method of manufacturing a semiconductor device according to some example embodiments.

Referring to FIG. 12, an isolation trench 104T may be formed in the substrate 102, and an isolation layer 104 may be formed in the isolation trench 104T. The active region 106 may be defined on the substrate 102 by the isolation layer 104.

Thereafter, a first mask (not shown) may be formed on the substrate 102, and the gate line trenches 108 may be formed on the substrate 102 by using the first mask as an etching mask. The gate line trenches 108 may extend parallel to each other and may have a line shape crossing the active region 106.

Thereafter, the gate insulating layer 122 may be formed on an inner wall of each of the gate line trenches 108. The gate electrode 124 may be formed by forming a gate conductive layer (not shown) filling the inside of each of the gate line trenches 108, and then removing an upper portion of the gate conductive layer by a particular (or, in some example embodiments, predetermined) height through an etch-back process.

Thereafter, an insulating material may be formed to fill a remaining portion of each of the gate line trenches 108 and the gate capping layer 126 may be formed on the inner wall of each of the gate line trenches 108 by planarizing the insulating material until an upper surface 102U of the substrate 102 is exposed. The first mask may then be removed.

Then, impurity ions may be implanted into the substrate 102 on both sides of the gate structure 120 to form the first and second source/drain regions 109A and 109B. In some example embodiments, after the isolation layer 104 is formed, impurity ions may be implanted into the substrate 102 to form the first and second source/drain regions 109A and 109B in an upper side of the active region 106.

Figure 13:
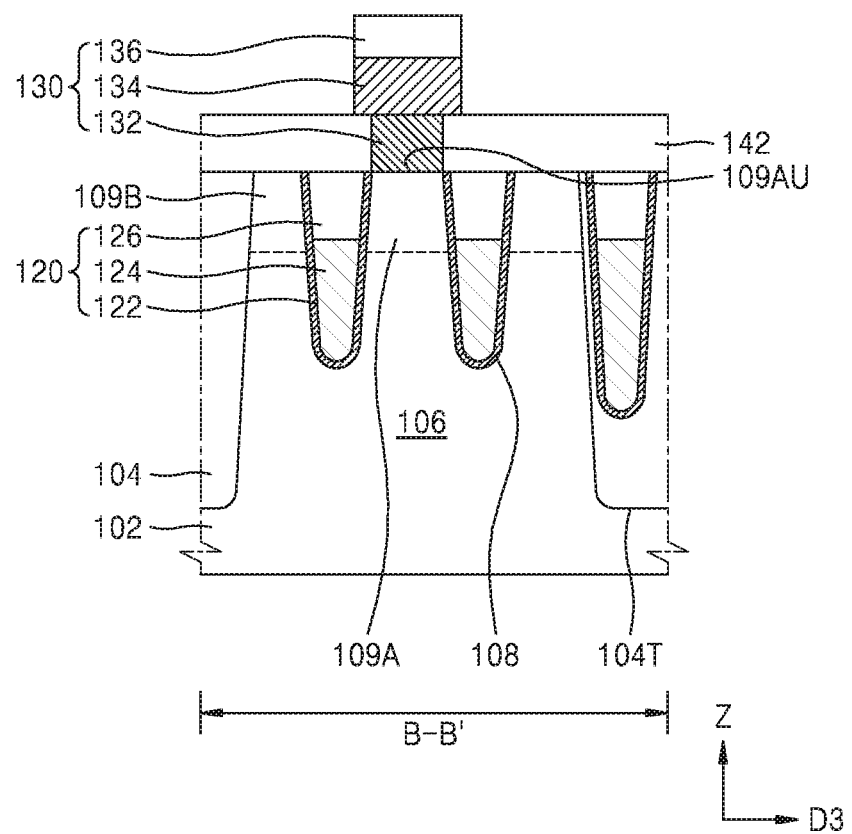

Referring to FIG. 13, the first insulating interlayer 142 may be formed on a substrate 102 and an opening (not shown) may be formed in the first insulating interlayer 142 to expose an upper surface 109AU of the first source/drain region 109A. A conductive layer (not shown) filling the opening may be formed on the first insulating interlayer 142 and the bit line contact 132 electrically connected to the first source/drain region 109A may be formed in the opening by planarizing an upper side of the conductive layer.

Thereafter, a conductive layer (not shown) and an insulating layer (not shown) may be sequentially formed on the first insulating interlayer 142, and the bit line capping layer 136 and the bit line 134 may be formed to extend in a Y direction (see FIG. 3) parallel to an upper surface 102U of the substrate 102 by patterning the insulating layer and the conductive layer. Although not shown, a bit line spacer (not shown) may be further formed on the bit line 134 and a sidewall of the bit line capping layer 136. The bit line spacer may include a plurality of insulating layers (not shown) including different materials and may further include an air space (not shown).

Figure 14:
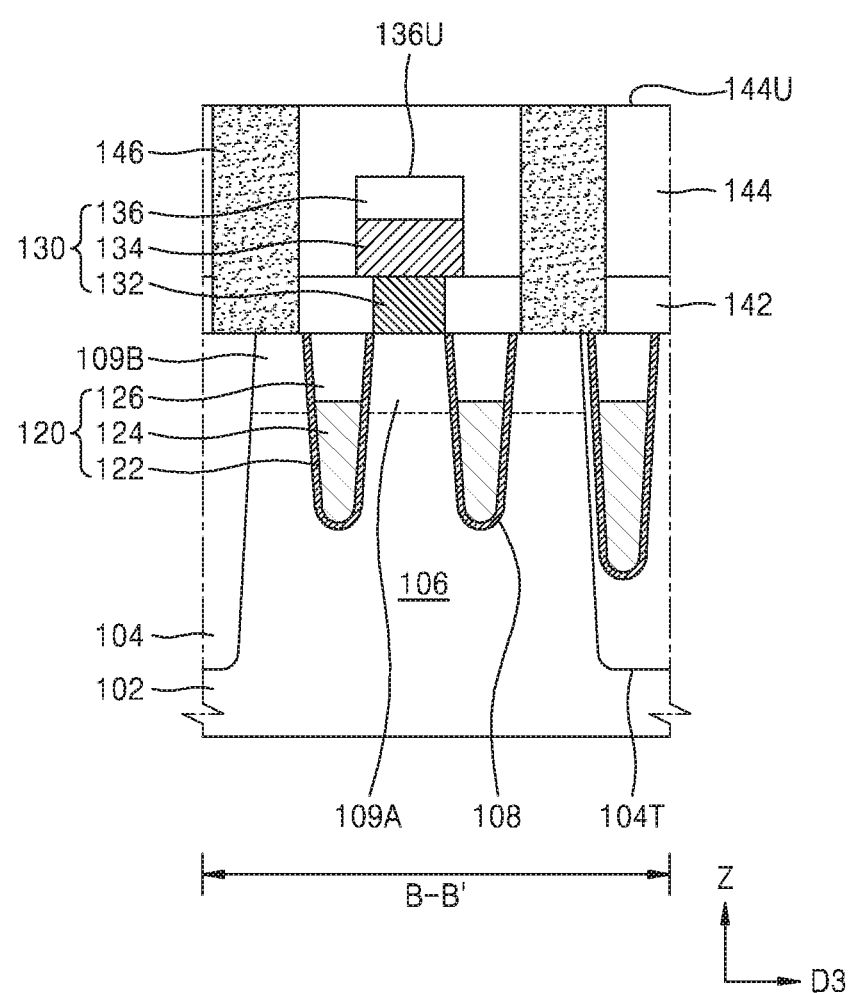

Referring to FIG. 14, a second insulating interlayer 144 covering the bit line 134 and the bit line capping layer 136 may be formed on the first insulating interlayer 142. An upper surface 144U of the second insulating interlayer 144 may be located at a higher level than an upper surface 136U of the bit line capping layer 136. In some example embodiments, unlike that shown in FIG. 14, an upper surface 144U of the second insulating interlayer 144 may be located at the same level as the upper surface 136U of the bit line capping layer 136.

Thereafter, an opening (not shown) exposing an upper surface of the second source/drain region 109B may be formed in the first and second insulating interlayers 142 and 144, and the contact structure 146 may be formed in the opening. In some example embodiments, the contact structure 146 may be formed by sequentially forming a lower contact pattern (not shown), a metal silicide layer (not shown), a barrier layer (not shown), and an upper contact pattern (not shown).

Figure 15:
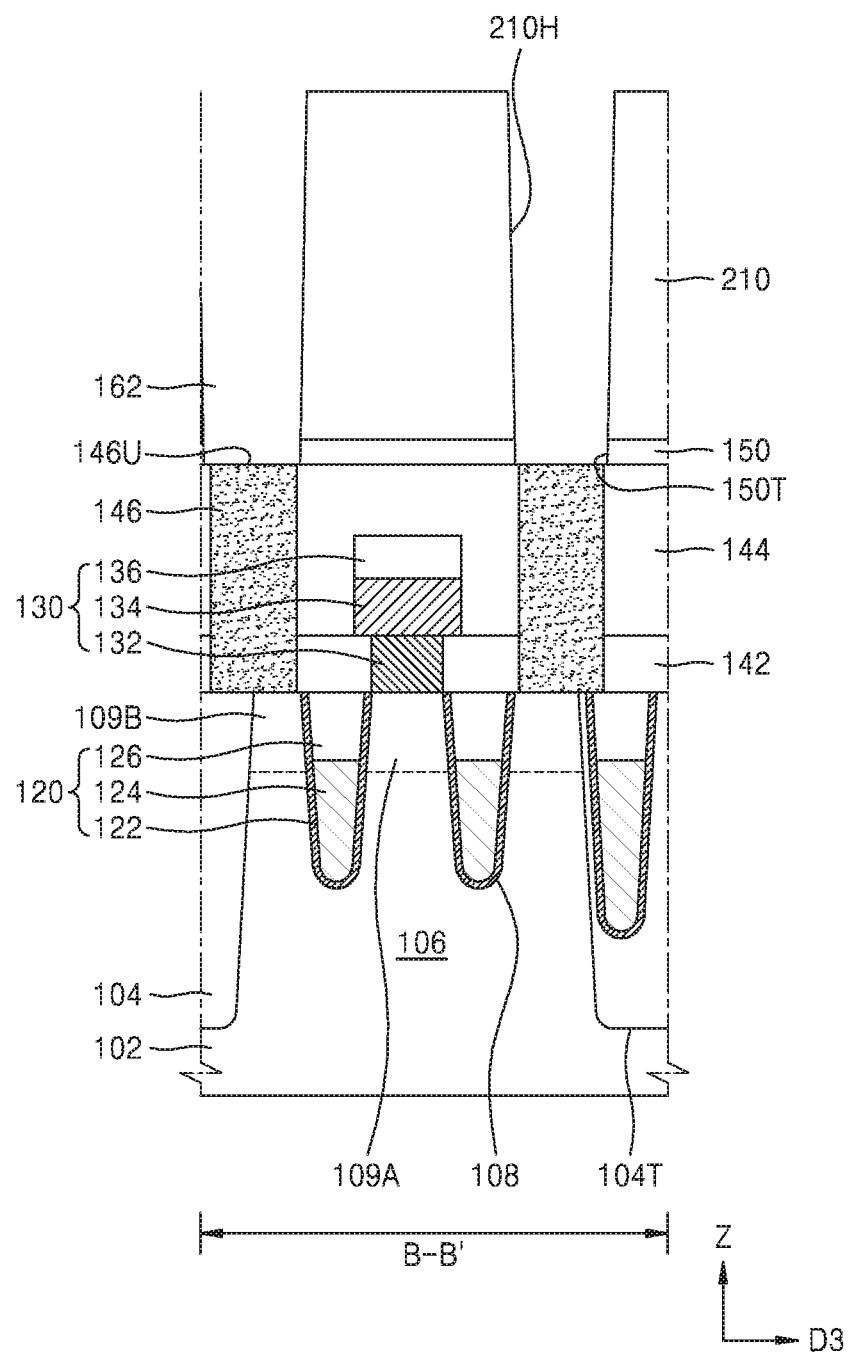

Referring to FIG. 15, the etch stop layer 150 and the mold layer 210 may be sequentially formed on the second insulating interlayer 144 and the contact structure 146 and then the opening 210H and the opening 150T may be formed in the mold layer 210 and the etch stop layer 150, respectively. An upper surface 146U of the contact structure 146 may be exposed by the opening 210H and the opening 150T.

In some example embodiments, the mold layer 210 and the etch stop layer 150 may include materials having etch selectivity relative to each other. For example, when the mold layer 210 includes silicon oxide, the etch stop layer 150 may include silicon nitride. In some example embodiments, the mold layer 210 may be formed in a plurality of layers using materials having different etch rates from each other.

Figure 16:
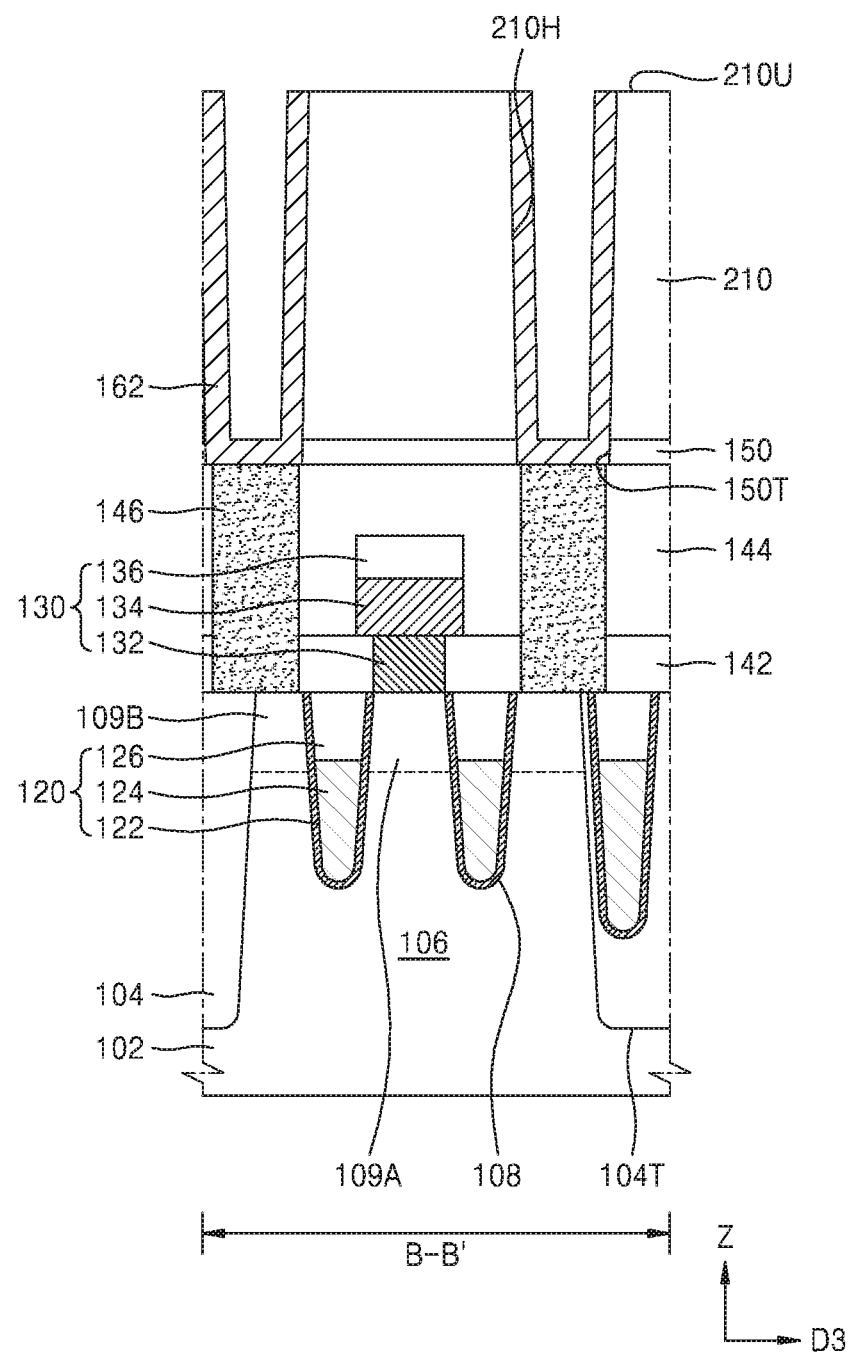

Referring to FIG. 16, a conductive layer (not shown) may be formed on the etch stop layer 150 and the mold layer 210 to conformally cover inner walls of the openings 150T and 210H, and then the lower electrode 162 may be formed by removing a part of the conductive layer located on an upper surface 210U of the mold layer 210.

Figure 17:
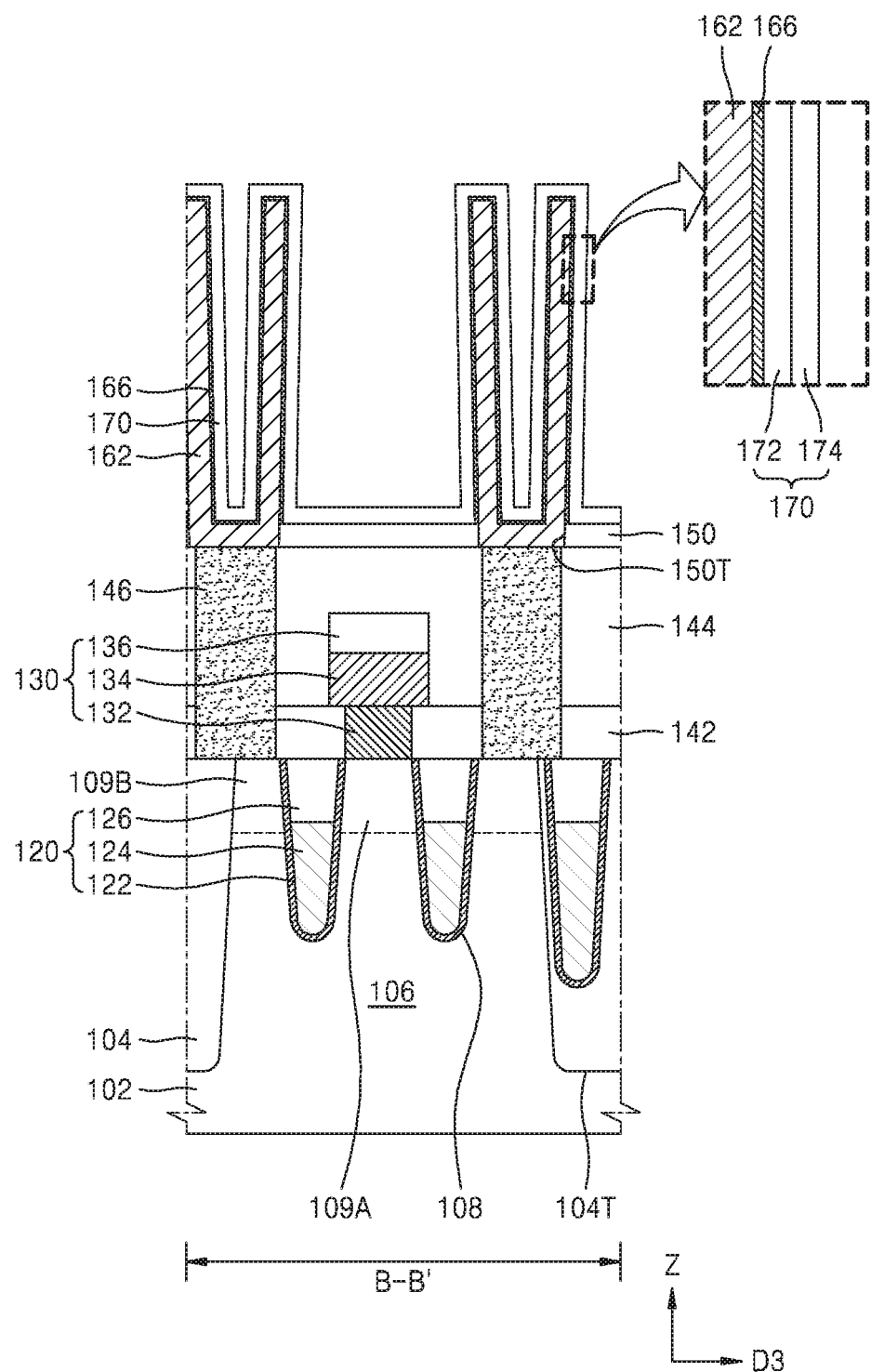

Referring to FIG. 17, the mold layer 210 (see FIG. 16) may be removed. In a process of removing the mold layer 210, the etch stop layer 150 may remain without being removed. The lower electrode 162 may be disposed on the contact structure 146 and may be formed in a cylinder shape having a closed bottom.

Thereafter, the crystallization inducing layer 166 may be conformally formed on the lower electrode 162 and the etch stop layer 150.

In some example embodiments, the crystallization inducing layer 166 may be formed using niobium nitride (NbNx) in a physical vapor deposition (PVD) process, a chemical vapor deposition (CVD) process, an organic metal CVD (MOCVD) process, an atom layer deposition (ALD) process, an organic metal ALD (MOALD) process, or the like. For example in some example embodiments, including the example embodiments shown in FIG. 4 where the first dielectric layer 172 is in contact with the crystallization inducing layer 166, the first dielectric layer 172 may include hafnium oxide having a tetragonal crystal phase, and the crystallization inducing layer 166 may include niobium nitride. In some example embodiments, the crystallization inducing layer 26 may include niobium nitride (NbNx) including a particular (or, in some example embodiments, predetermined) content of oxygen, for example, within about 5 atomic percent (at %) but is not limited thereto.

Thereafter, a protective layer (not shown) covering an upper surface of the crystallization inducing layer 166 may be formed on the lower electrode 162, and then an anisotropic etching process may be performed on the crystallization inducing layer 166 to remove a part of the crystallization inducing layer 166 disposed on an upper surface of the etch stop layer 150.

In other embodiments, before the lower electrode 162 is formed, a first layer of the crystallization inducing layer 166 may be formed on an inner wall of the mold layer 210 and then the lower electrode 162 may be formed on the crystallization inducing layer 166, and a second layer of the crystallization inducing layer 166 may be formed on the lower electrode 162.

Thereafter, the first dielectric layer 172 and the second dielectric layer 174 may be sequentially formed on the crystallization inducing layer 166 and the etch stop layer 150. The first dielectric layer 172 may be formed through a PVD process, a CVD process, an MOCVD process, an ALD process, an MOALD process, or the like using hafnium oxide.

Referring again to FIG. 4, the upper electrode 164 may be formed on the second dielectric layer 174.

Thereafter, an annealing process may be performed. The annealing process may be performed at a temperature of about 200° C. to 500° C. for several minutes to several hours. In the annealing process, the first dielectric layer 172 in contact with the crystallization inducing layer 166 may be formed to have a tetragonal crystal phase over the entire area. In the annealing process, the first dielectric layer 172 in contact with the crystallization inducing layer 166 may be crystallized to be preferentially oriented in the tetragonal crystal phase due to the crystallization inducing layer 166.

Generally, a diameter of the lower electrode 162 decreases and an aspect ratio of the lower electrode 162 increases according to scale-down of the semiconductor device. Therefore, a thickness of the dielectric layer structure 170 conformally formed on an inner wall of the lower electrode 162 needs to be thin. As described with reference to FIG. 1, the dielectric layer structure 170 may include hafnium oxide having the tetragonal crystal phase, and tetragonal hafnium oxide has a relatively high dielectric constant, and thus the capacitor structure 160 may have a relatively high capacitance. Also, since the crystallization inducing layer 166 includes a material having a higher work function than that of titanium nitride, leakage current may be reduced.

FIGS. 18 to 21 are cross-sectional views sequentially showing a method of manufacturing the semiconductor device 100G according to some example embodiments.

First, a process described with reference to FIGS. 12 to 14 is performed to obtain a structure in which the second insulating interlayer 144 and the contact structure 146 are formed.

Figure 18:
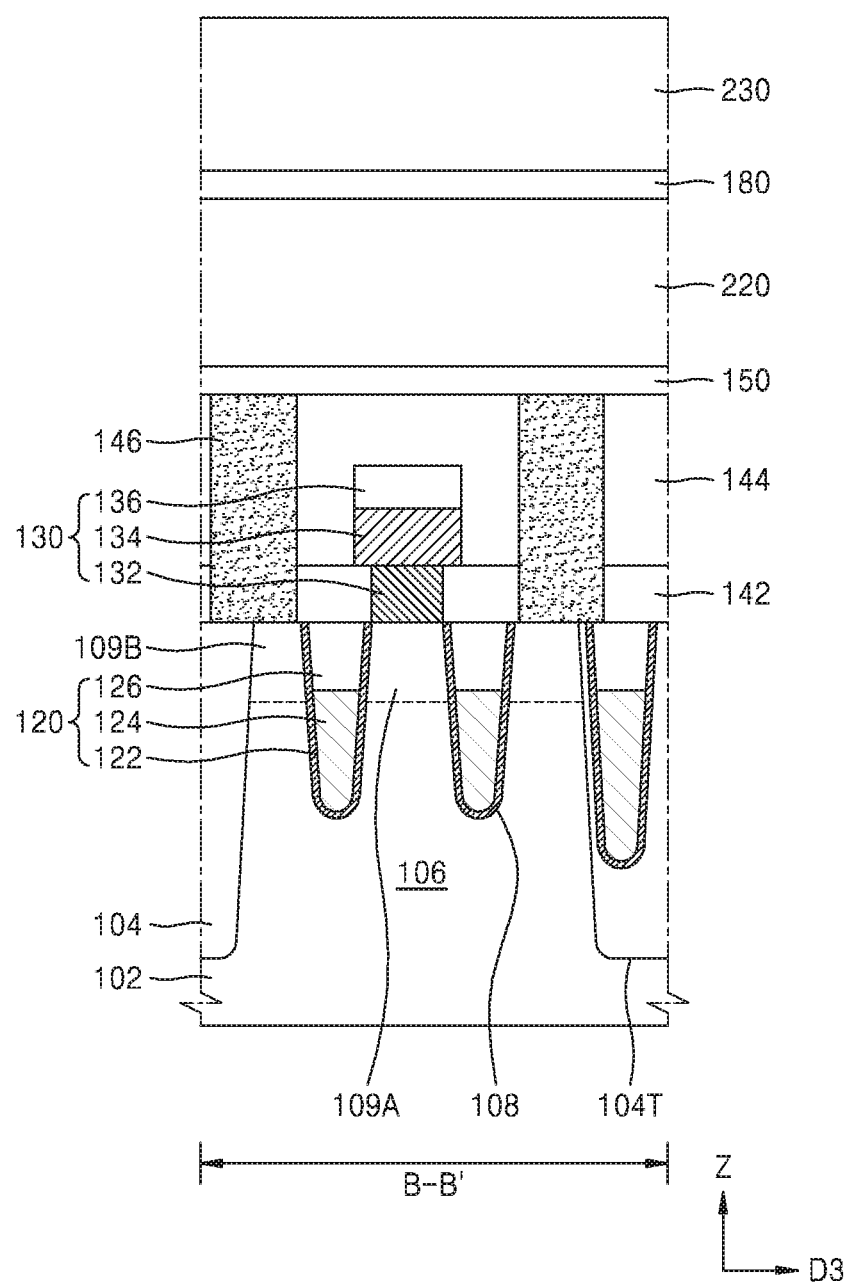
FIGS. 18, 19, 20, and 21 are cross-sectional views sequentially illustrating a method of manufacturing the semiconductor device according to some example embodiments.

Referring to FIG. 18, the etch stop layer 150, the first mold layer 220, the support member 180, and the second mold layer 230 may be sequentially formed on the second insulating interlayer 144 and the contact structure 146.

In some example embodiments, the etch stop layer 150 and the first and second mold layers 220 and 230 may include materials having etch selectivity relative to each other. Also, the support member 180 and the first and second mold layers 220 and 230 may include materials having etch selectivity relative to each other. The first and second mold layers 220 and 230 may include the same material or may include different materials. For example, the first and second mold layers 220 and 230 may include silicon oxide, and the etch stop layer 150 and the support member 180 may include silicon nitride.

Figure 19:
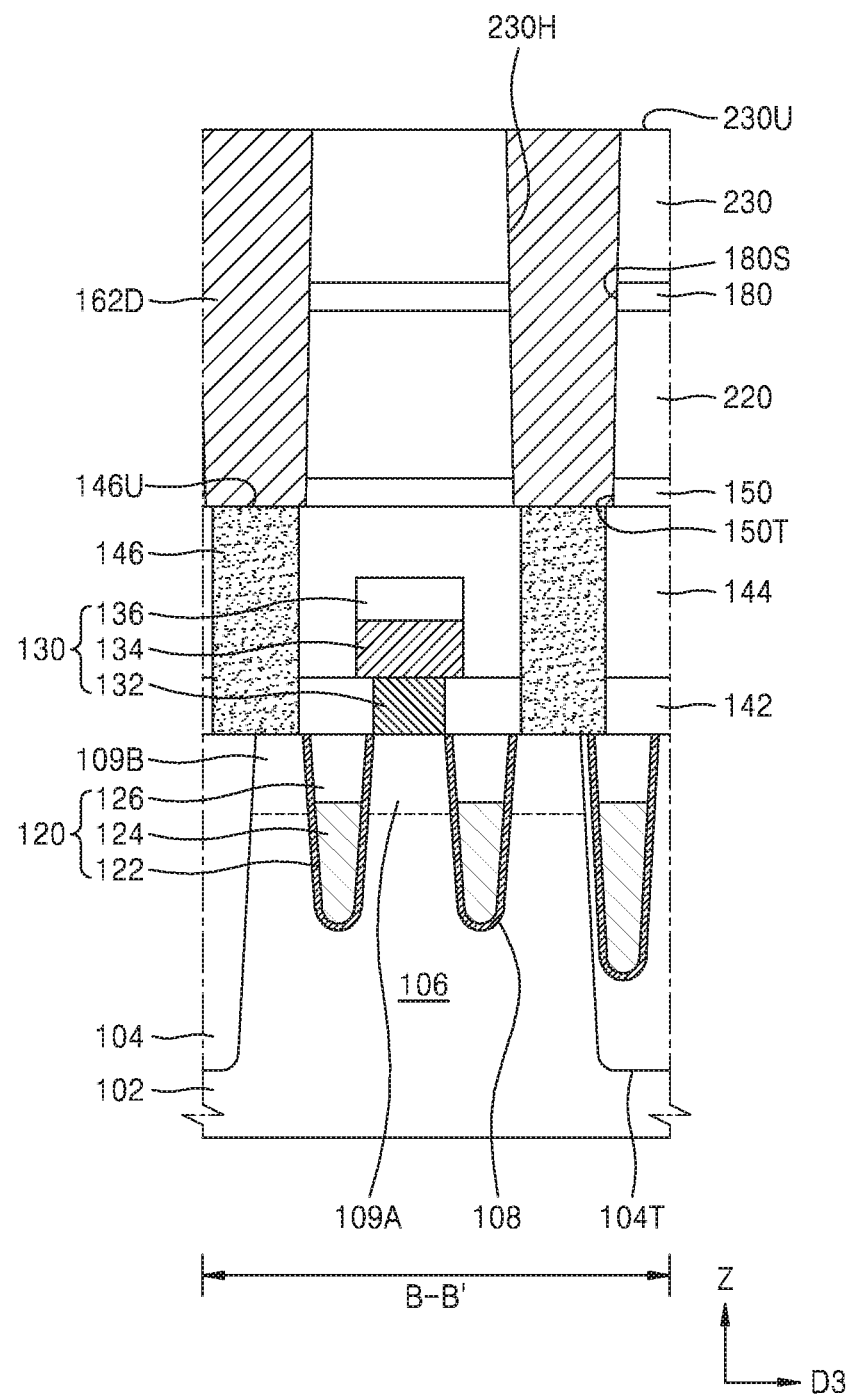

Referring to FIG. 19, an opening 230H penetrating through the second mold layer 230, the support member 180 and the first mold layer 220 and an opening 150T penetrating through the etch stop layer 150 may be sequentially formed. An upper surface 146U of the contact structure 146 may be exposed by the openings 230H and 150T. A side surface 180S of the support member 180 may be exposed on an inner wall of the opening 230H.

Thereafter, a lower electrode layer (not shown) filling the openings 150T and 230H may be formed on the second mold layer 230 and a part of an upper portion of the lower electrode layer may be etched back until an upper surface 230U of the second mold layer 230 is exposed such that the lower electrode 162D may be formed in the openings 150T and 230H.

The lower electrode 162D may be formed in a pillar shape to fill the openings 150T and 230H. The support member 180 may be in contact with a side wall of the lower electrode 162D.

Figure 20:
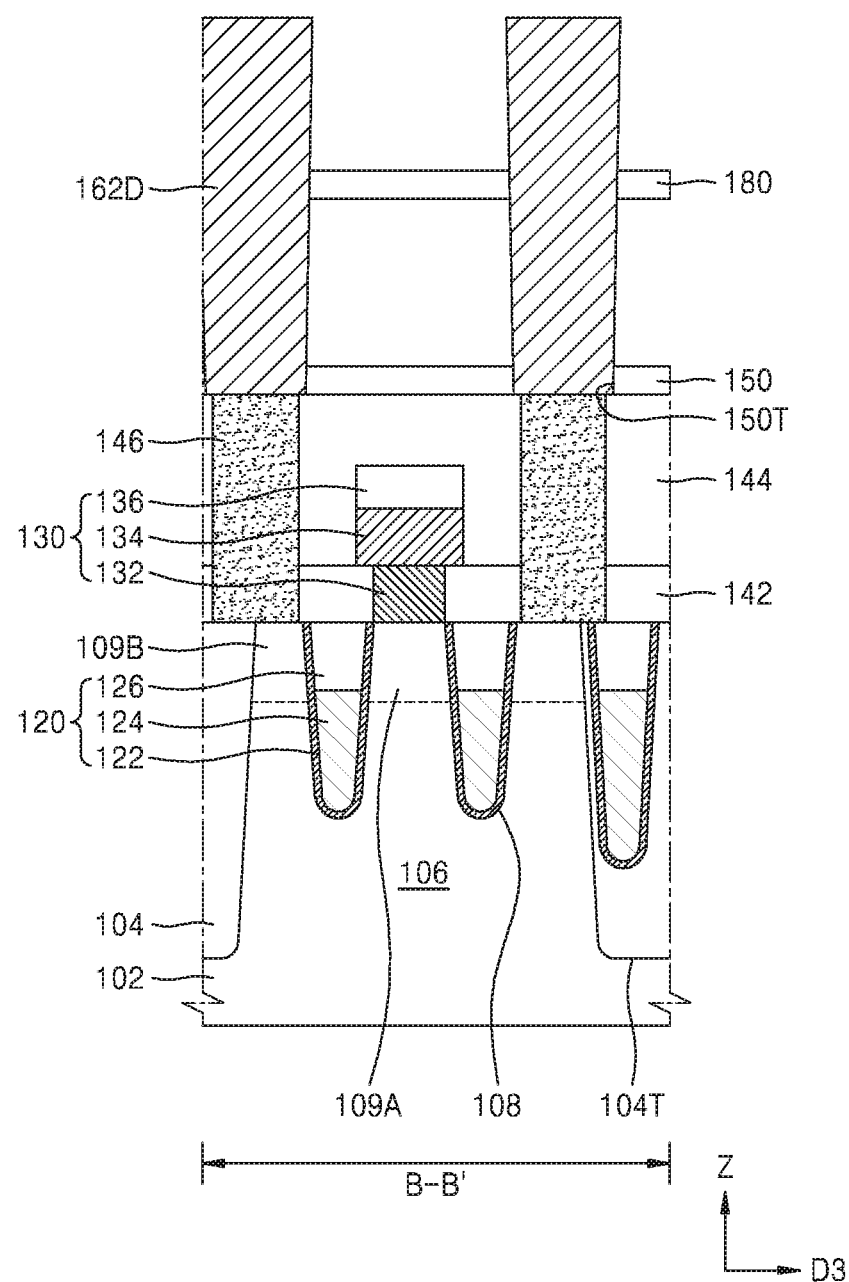

Referring to FIG. 20, the first and second mold layers 220 and 230 (see FIG. 19) may be removed.

The second mold layer 230 may be removed and a patterning process for forming an opening region (not shown) in the support member 180 may be performed, and then the first mold layer 220 may be removed through the open region, but is not limited thereto. The patterning process for forming the open region may be performed in a process of forming the support member 180, unlike the process described above.

Meanwhile, in a process of removing the first and second mold layers 220 and 230, the support member 180 may remain without being removed. The support member 180 may be disposed between the lower electrode 162D and a neighboring lower electrode 162D to prevent the lower electrode 162D from collapsing or leaning.

Figure 21:
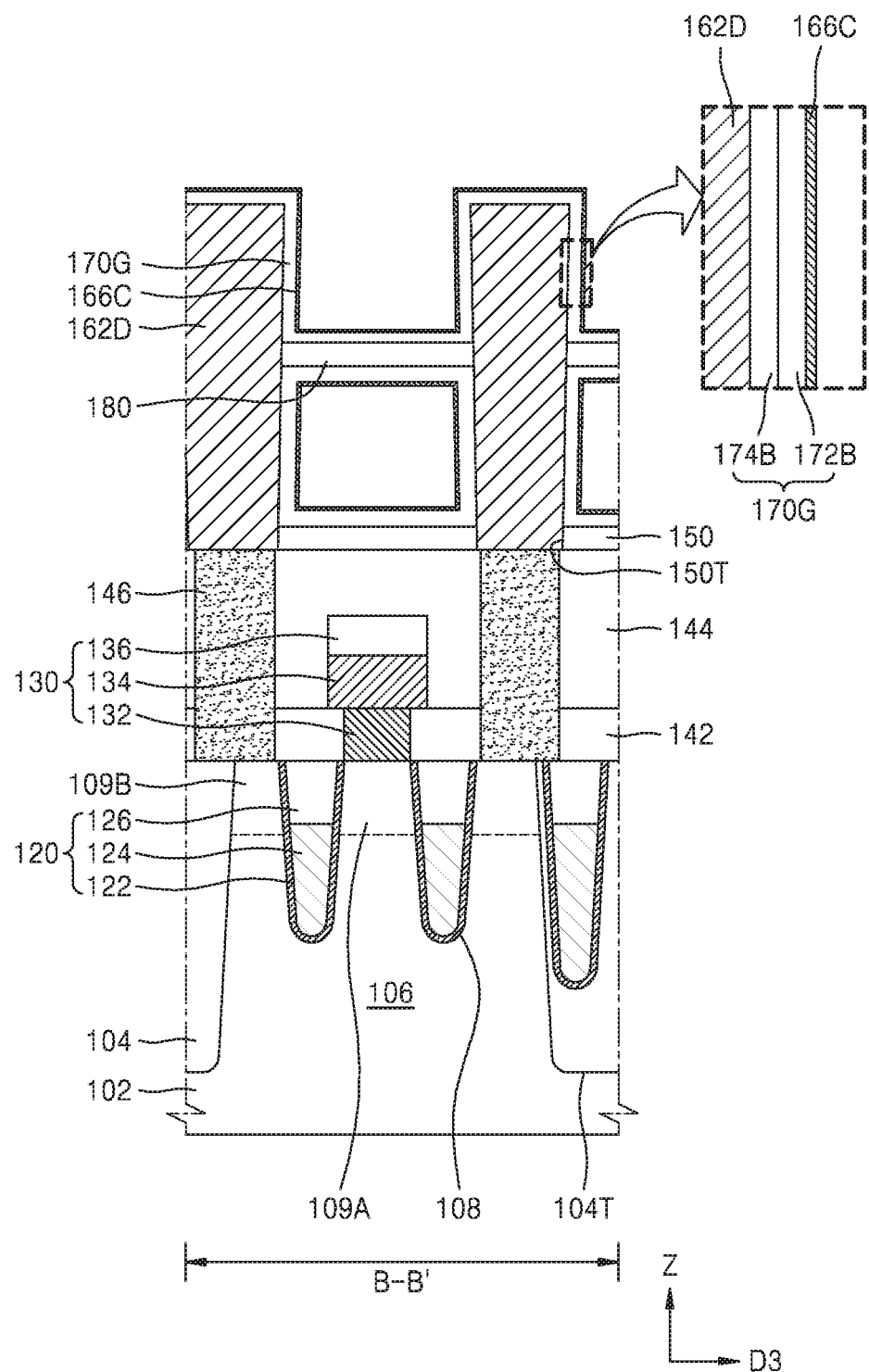

Referring to FIG. 21, a second dielectric layer 174B and a first dielectric layer 172B may be sequentially formed on the etch stop layer 150 and the lower electrode 162D. A dielectric layer structure 170G including the first dielectric layer 172B and the second dielectric layer 174B may be formed conformally on the lower electrode 162D and the support member 180.

Thereafter, the crystallization inducing layer 166C may be formed on the first dielectric layer 172B.

Referring again to FIG. 11, the upper electrode 164D may be formed on the crystallization inducing layer 166C.

Thereafter, an annealing process may be performed.

The semiconductor device 100G may be completed by performing the above-described process.

While the inventive concepts have been particularly shown and described with reference to example embodiments thereof, it will be understood that various changes in form and details may be made therein without departing from the spirit and scope of the following claims.

What is claimed is:

1. A semiconductor device comprising:
a first electrode on a substrate;
a second electrode on the substrate;
a dielectric layer structure between the first electrode and the second electrode; and
a crystallization inducing layer between the dielectric layer structure and the first electrode, the crystallization inducing layer including niobium nitride (NbN),
wherein the dielectric layer structure includes
a first dielectric layer including a first dielectric material, and
a second dielectric layer on the first dielectric layer, the second dielectric layer including a second dielectric material,
wherein the first dielectric material includes hafnium oxide having a tetragonal crystal phase, and the first dielectric layer has a thickness that is equal to or greater than about 20 Å, and
wherein the first dielectric layer is on a surface of the crystallization inducing layer, and the surface of the crystallization inducing layer and a surface of the first dielectric layer are in contact with each other.

2. The semiconductor device of claim 1, wherein the crystallization inducing layer includes a material having a work function that is greater in magnitude than a work function of the first electrode and a work function of the second electrode.

3. The semiconductor device of claim 1, wherein the second dielectric material includes at least one material of zirconium oxide, aluminum oxide, silicon oxide, titanium oxide, yttrium oxide, scandium oxide, or lanthanide oxide.

4. The semiconductor device of claim 1, wherein the thickness of the first dielectric layer is equal to or greater than about 40% of a thickness of the dielectric layer structure.

5. The semiconductor device of claim 1, wherein the dielectric layer structure is configured to exhibit a peak radiation emission of 30.48°±0.2° by a {101} plane of a tetragonal crystal structure of the first dielectric layer based on being subjected to an X-ray diffraction analysis.

6. The semiconductor device of claim 1, further comprising:
a second crystallization inducing layer between the second electrode and the dielectric layer structure.

7. The semiconductor device of claim 6, wherein
the second dielectric layer is in contact with the second crystallization inducing layer, and
the second dielectric layer has a dielectric constant that is smaller than a dielectric constant of the first dielectric layer.

8. The semiconductor device of claim 1, wherein the dielectric layer structure has a dielectric constant of about 40 to about 60.

9. A semiconductor device comprising:
a contact structure on a substrate; and
a capacitor structure on the contact structure,
wherein the capacitor structure includes
a lower electrode electrically connected to the contact structure,
a dielectric layer structure on the lower electrode, the dielectric layer structure including
a first dielectric layer including a first dielectric material, and
a second dielectric layer on the first dielectric layer, the second dielectric layer including a second dielectric material,
an upper electrode on the dielectric layer structure, and
a crystallization inducing layer between the lower electrode and the first dielectric layer, the crystallization inducing layer including a metal material, the metal material having a work function that is greater than a work function of titanium nitride,
wherein the first dielectric layer is on a surface of the crystallization inducing layer, and the surface of the crystallization inducing layer and a surface of the first dielectric layer are in contact with each other,
wherein the first dielectric material includes hafnium oxide having a tetragonal crystal phase, and the first dielectric layer has a thickness that is equal to or greater than about 20 Å, and
wherein the crystallization inducing layer includes niobium nitride.

10. The semiconductor device of claim 9, wherein the second dielectric layer has a dielectric constant that is smaller than a dielectric constant of the first dielectric layer.

11. The semiconductor device of claim 9, wherein the dielectric layer structure is configured to exhibit a peak radiation emission of 30.48°±0.2° by a {101} plane of a tetragonal crystal structure of the first dielectric layer based on being subjected to an X-ray diffraction analysis.

\* \* \* \* \*